(12) United States Patent
Thomas et al.

(10) Patent No.: US 6,893,705 B2
(45) Date of Patent: May 17, 2005

(54) LARGE AREA ORIENTATION OF BLOCK COPOLYMER MICRODOMAINS IN THIN FILMS

(75) Inventors: Edwin L. Thomas, Natick, MA (US); Claudio DeRosa, Naples (IT); Cheolmin Park, Seoul (KR); Michael Fasolka, Washington, DC (US); Bernard Lotz, Strasbourg (FR); Anne M. Mayes, Waltham, MA (US); Jongsesung Yoon, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/156,700

(22) Filed: May 28, 2002

(65) Prior Publication Data

US 2003/0118800 A1 Jun. 26, 2003

Related U.S. Application Data

(60) Provisional application No. 60/293,746, filed on May 25, 2001, and provisional application No. 60/381,637, filed on May 17, 2002.

(51) Int. Cl.[7] .............................. B82B 1/00; B82B 3/00
(52) U.S. Cl. ...................... 428/141; 428/143; 428/221; 428/409; 427/198; 427/430.1; 997/DIG. 1
(58) Field of Search ................................ 428/141, 143, 428/221, 409; 977/DIG. 1; 427/198, 430.1

(56) References Cited

U.S. PATENT DOCUMENTS

| | | | |
|---|---|---|---|
| 5,948,470 A | * | 9/1999 | Harrison et al. ............. 427/198 |
| 6,413,621 B1 | * | 7/2002 | Mayes et al. ................ 428/212 |
| 6,645,626 B2 | * | 11/2003 | Garcia et al. ............... 428/402 |
| 2002/0055239 A1 | * | 5/2002 | Tuominen et al. .......... 438/466 |
| 2003/0185741 A1 | * | 10/2003 | Matyjaszewski et al. ...................... 423/445 R |

OTHER PUBLICATIONS de Rosa et al, "Microdomain Patterns from Directional Eutectic Solidifiation and Epitaxy", Nature 405: pp 433–437 (May 25, 2000).*
Reiter et al. (Direct Visualization of Random Crystallization and Melting in Arrays of Nanometer–Size Polymer Crystals, Physical Review Letters, Nov. 26, 2001.*
Volkmuth et al., "DNA electrophoresis in microlithographic assays," Nature 358, p. 600, 1992.
Chou et al, "Single–domain magnetic pillar array of 35–nm diameter and 65–Gbtits/in$^2$ density for ultra high density quantum magnetic storage," J. Appl. Phys. 76, p. 6673 (1994).
Mansky et al., "Monolayer films of diblock copolymer microdomains for nanolithographic applications," J. Mater. Sci 30, p. 1987 (1995).
Park et al., "Block copolymer lithography: Periodic arrays of~1011 holes in 1 square centimeter," Science 276, p. 1401 (1997).
Thomas et al., "Ordered Packing Arrangements of Spherical Micelles of Diblock Copolymers in Two and Three Dimensions," Macromolecules, 20, p. 2934 (1987).

(Continued)

*Primary Examiner*—D. Lawrence Tarazano
(74) *Attorney, Agent, or Firm*—Wolf, Greenfield & Sacks P.C.

(57) ABSTRACT

A method and apparatus for orientation of block copolymer microdomains via rapid solidification. Rapid solidification from a solvent may include directional solidification and/or epitaxy to form patterns of microdomains in a film of block copolymer. Microdomains may include various structures formed by components of a block copolymer, such as vertical lamellae, in-plane cylinders, and vertical cylinders, and may depend on film thickness. Orientation of structures in microdomains may be controlled to be approximately uniform, and spatial arrangement of microdomains may be controlled.

38 Claims, 19 Drawing Sheets

OTHER PUBLICATIONS

Lammertink et al., "Nanostructured Thin Films of Organic–Organometallic Block Copolymers: One–Step Lithography with Poly(ferrocenylsilanes) by Reactive Ion Etching," Adv. Mater, 12, p. 98 (2000).

Li et al., "Dense arrays of ordered GaAs nanostructures by selective area growth on substrates patterned by block copolymer lithography", Appl. Phys. Lett. vol. 76, No. 13, p. 1689 (2000).

Boontongkong et al., " Selective Electroless Copper Deposition within Block Copolymer Microdomains", Chem Mater., 12, p. 1628 (2000).

Fogg et al., "Fabrication of Quantum Dot–Polymer Composites: Semiconductor Nanoclusters in Dual–Function Polymer Matrices with Electron–Transporting and Cluster–Passivating Properties", Macromolecules, 30, p. 8433 (1997).

Muthukumar et al., "Competing Interactions and Levels of Ordering in Self–Organizing Polymeric Materials," Science 277, p. 1225 (1997).

Bates et al., "Block Copolymer Thermodynamics: Theory and Experiment," Annu. Rev. Phys. Chem., 41, p. 525 (1990).

Fink et al., "Block Copolymers as Photonic Bandgap Materials", J. Lightwave Tech., vol. 17, No. 11, p. 1963 (1999).

Urbas et al., "Tunable Block Copolymer/Homopolymer Photonic Crystals", Adv. Mater, vol. 12, No. 11, p. 812 12, 812 (2000).

Hashimoto et al., "Microphase Separation and the Polymer–Polymer Interphase in Block Polymers, Science and Technology," D.J. Meier ed. (Harwood Academic Publ. London, p. 63–108, 1983).

Swei et al. "Encyclopedia of Polymer Science and Engineering," (Wiley, New York, 6, p. 209, 1986).

Wittmann et al., "Epitaxial crystallization of polymers on organic and polymeric substrates," Prog. Polym. Sci., 15, p. 909 (1990).

Morkved et al, "Local control of microdomain orientation in diblock copolymer thin films with electric fields," Science 273, p. 931 (1996).

Mansky et al., "Large–area domain alignment in block copolymer thin films using electric fields," Macromolecules 31, p. 4399 (1998).

Fasolka et al., "Observed substrate topography–mediated lateral patterning of diblock copolymer films", Phys. Rev. Lett. vol. 79, No. 16, p. 3018 (1997).

Huang et al., "Nanodomain control in copolymer thin films" Nature, 395, p. 757 (1998).

Huang et al., "Using surface active random copolymers to control the domain orientation in diblock copolymer thin films," Macromolecules, 31, p. 7641 (1998).

Keller et al., "Macro–lattice from Segregated Amorphous Phases of a Three Block Copolymer", Nature, 225, p. 538 (1970).

Morrison et al., Effect of unidirectional Shear on the Structure of Triblock Copolymers. 2. Polystyrene–Polyisoprene–Polystyrene, Macromolecules, 23, p. 4200 (1990).

Vigild et al., "Transformations to and from the Gyroid Phase in a Diblock Copolymer," Macromolecules, 31, p. 5702 (1998).

Koppi et al., "Epitaxial growth and shearing of the body centered cubic phase in diblock copolymer melts," J. Rheol., 38, p. 999 (1994).

Pinheiro et al., "Mixed Parallel—Perpendicular Morphologies in Diblock Copolymer Systems Correlated to the Linear Viscoelastic Properties of the Parallel and Perpendicular Morphologies," Macromolecules, 31, p. 4447 (1998).

Lee et al., "Orientation of Triblock Copolymers in Planar Extension," Polym. Eng. Sci., vol. 36, No. 10, p. 1414 (1997).

Quiram et al., "Chain Orientation in Block Copolymers Exhibiting Cylindrically Confined Crystallization," Macromolecules, 31, p. 4891 (1998).

Albalak et al., "Microphase Separation of Block Copolymer Solutions in a Flow Field," J. Polym. Sci., Polym. Phys. Ed., 31, p. 37 (1993).

Bodycomb et al., "Single–Grain Lamellar Microdomain from a Diblock Copolymer," Macromolecules, 32, p. 2075 (1999).

Amundson et al., "Alignment of Lamellar Block Copolymer Microstructure in an Electric Field. 2. Mechanisms of Alignment," Macromolecules, 27, p. 6559 (1994).

Thurn–Albrecht et al., "Ultrahigh–Density Nanowire Arrays Grown in Self–Assembled Diblock Copolymer Templates," Science 290, p. 2126 (2000).

Fasolka et al., "Morphology of Ultrathin Supported Diblock Copolymer Films: Theory and Experiment," Macromolecules, 33, p. 5702 (2000).

Rockford et al., " Polymers on Nanoperiodic, Heterogeneous Surfaces," Phys. Rev. Lett., 82, p. 2602 (1999).

* cited by examiner

LARGE AREA ORIENTATION OF BLOCK COPOLYMER MICRODOMAINS IN THIN FILMS

RELATED APPLICATIONS

This application claims priority under 35 USC §119 of U.S. Provisional Application No. 60/293,746, filed May 25, 2001, and of U.S. Provisional Application No. 60/381.637, filed May 17, 2002, which are hereby incorporated by reference in their entirety.

This invention was made with government support NSF Grant Number DMR-9705271, NSF Grant Number DMR-9807591 and NSF Grant Number DMR-9808941. The government has certain rights to the invention.

BACKGROUND OF THE INVENTION

1. Field of Invention

The invention relates to the orientation of polymers and, more particularly, to orienting copolymer microdomains in thin films.

2. Description of Related Art

The creation of a regular surface pattern on the nanometer scale is important for many applications. For instance, periodic arrays constructed by optical microlithography are used as separation media in electrophoresis, as described by Volkmuth et al. in "DNA electrophoresis in microlithographic arrays," Nature 358, 600 (1992). Island structures can be used for high density magnetic recording devices, as described by Chou et al., in "Single-domain magnetic pillar array of 35-nm diameter and 65-Gbtits/in$^2$ density for ultra high density quantum magnetic storage," J. Appl. Phys. 76, 6673 (1994). Periodic nanostructures can also be useful, for instance, in thin films as templates for lithography as described by Mansky et al., in "Monolayer films of diblock copolymer microdomains for nanolithographic applications," J. Mater. Sci. 30, 1987 (1995), Park et al. in "Block copolymer lithography: periodic arrays of ~10$^{11}$ holes in 1 square centimeter," Science 276, 1401 (1997), Thomas et al. in Macromolecules, 20, 2934 (1987), Lammertink et al. in Adv. Mater., 12, 98 (2000), and Li et al. in Appl. Phys. Lett., 76, 1689 (2000). By chemically removing one polymer from a thin film, patterns in the film may be transferred to a substrate either through reactive etching or by thermal evaporation of a component into the previously removed regions. Additionally, the domains can be used as a template for decoration with nanoparticles as described by Boontongkong et al. in Chem. Mater., 12, 1628 (2000), Fogg et al. in Macromolecules, 30, 8433 (1997) and Fink et al. in J. Lightwave Technol., 17, 1963 (1999).

One class of materials that has shown promise in forming such nanostructures includes block copolymers. Block copolymers generally include chemically distinct macromolecules covalently linked to form a single chain and due to their mutual repulsion, the dissimilar blocks tend to segregate into different domains whose shape, size and spacing are determined by the relative amount of the block components and their respective molecular weights. See, for example, Muthukumar et al. in "Competing interactions and levels of ordering in self-organizing polymeric materials," Science 277, 1225 (1997), and Muthukumar et al. in "Competing interactions and levels of ordering in self-organizing polymeric materials," Science, 277, 1225 (1997). As a result, the self-assembly features of block copolymers may be harnessed to produce structures on the nanoscopic length scale as described, for example, by Bates et al. in Annu. Rev.Phys. Chem., 41, 525 (1990); Fink, et al. in J. Lightwave Tech., 17, 1963 (1999), Urbas et al. in Adv. Mater., 12, 812 (2000), Li et al. in Appl. Phys. Lett, 76, 1689 (2000), and Park et al. in Science, 276, 1401 (1997).

Optimal utilization of nanoscopic patterns, however, requires spatial and orientational control of microdomains in a material. Indeed, the microdomains composed of the different blocks, having sizes of several tens of nanometers, typically nucleate randomly and grow into a polygranular texture, with periodic ordering maintained only over distances of about 50 lattice constants (i.e., a grain size of only 1–2 microns). A greater range of engineering applications demands control over the orientation and position of the microdomains. Thus, the development of processing techniques which create global orientation of the microdomains in block copolymer thin films is an important goal.

In crystalline materials, control of the solidification process is key to many technologies which rely on the features of the resultant microstructure for achieving optimum properties. For example, the directional solidification of a eutectic metal alloy can lead to rod or lamellar structures well aligned along to the growth direction. See, for example, Hashimoto et al. in "In Block Copolymers, Science and Technology," D. J. Meier ed. (Harwood Academic Publ. London, p 63–108, 1983). In crystalline polymeric materials, orientation of crystallizable macromolecules has been achieved by mechanical forces as in fiber spinning and also by epitaxial crystallization onto substrates, as described by Swei et al. in "Encyclopedia of Polymer Science and Engineering," (Wiley, N.Y., 6, 209, 1986), Wittmann et al. in "Epitaxial crystallization of polymers on organic and polymeric substrates," Prog. Polym. Sci., 15, 909 (1990).

Although some success has been found in the formation of such regular surface patterns, existing techniques may in some cases be time consuming, difficult to control, and/or not allow the formation of patterns having a desired size, shape, orientation, periodicity, or other features. For example, control over domain orientation with block copolymer materials has been achieved using electric fields by Morkved et al. in "Local control of microdomain orientation in diblock copolymer thin films with electric fields," Science 273, 931 (1996) and Mansky et al. in "Large-area domain alignment in block copolymer thin films using electric fields," Macromolecules 31, 4399 (1998). Domain orientation and lateral spacing by deposition onto topographically patterned substrates has been shown by Fasolka et al. in "Observed substrate topography-mediated lateral patterning of diblock coplymer films," Phys. Rev. Lett., 79, 3018 (1997), as well as by confining the block copolymer between neutral surfaces using random copolymer covered substrates and superstrates by Huang et al. in "Nanodomain control in copolymer thin films," Nature, 395(6704), 757 (1998) and Huang et al. in "Using surface active random copolymers to control the domain orientation in diblock copolymer thin films," Macromolecules," 31, 7641 (1998). Other techniques have been used to induce alignment of the microdomains in block copolymers. See for example, Keller et al. in Nature, 225, 538 (1970); Hadziioannou et al. in Colloid Polym. Sci., 257, 136 (1979); Morrison et al. in Macromolecules, 23, 4200 (1990); Vigild et al. in Macromolecules, 31, 5702 (1998); Koppi et al. in J. Rheol., 38, 999 (1994); Pinheiro et al. in Macromolecules, 31, 4447 (1998); et al. in Polym. Eng. Sci., 36, 1414 (1997); Quiram et al. in Macromolecules, 31, 4891 (1998); Albalak et al. in J. J. Polym. Sci., Polym. Phys. Ed., 31, 37 (1993); et al. in Macromolecules, 32, 2075 (1999); Amundson et al. in Macromolecules, 27, 6559 (1994); Thurn-Albrecht et al. in Science, 290, 2126 (2000); Fasolka et al. in Macromolecules, 33, 5702 (2000); Huang et al. in Macromolecules, 31, 7641 (1998); Fasolka et al. in *Phys. Rev. Lett.*, 79, 3018 (1997) and Rockford et al. in *Phys. Rev. Lett.*, 82, 2602 (1999). Many of these techniques typically couple an externally applied field to some molecular and/or supermolecular feature in the polymer to achieve directional properties, such as transport, optical, and mechanical properties. According to these techniques, if an applied bias field (mechanical, electric, temperature, etc.) is present during the self-assembly process, preferential orientation can develop instead of random nucleation of microdomains. Control of film thickness is another way to vary the orientation of microdomains. Fasolka et al. in *Macromolecules*, 33, 5702 (2000) examined the phase behavior of a lamellar-forming block copolymer for film thicknesses less than the period of block copolymer on $SiO_2/Si$ substrates. They showed that either parallel or perpendicular ordering can be obtained depending on film thickness and interfacial energy between the substrate and the block copolymer. However, these approaches have not produced uniform periodic structures in which both microdomain components traverse across a thin film and present a chemically-patterned free surface.

SUMMARY OF THE INVENTION

In at least one aspect of the invention, a thin film structure including block copolymer material provides a chemically-patterned surface that is substantially defect-free over a relatively large area and has controlled domain orientation and periodicity.

In one aspect of the invention, a block copolymer, such as an amorphous or semi-crystalline block copolymer, may be rapidly solidified from a solvent. Rapid solidification from the solvent may include directional solidification (i.e., solidification of at least a portion of the block copolymer material that occurs largely in a particular direction and results in some preferential orientation of the solidified block copolymer material) and/or epitaxy (i.e., crystallization of at least a portion of the block copolymer that is influenced by a substrate material, such as a crystallized solvent material). As a result, a thin film including a block copolymer may be rapidly formed, e.g., in a few seconds, that has one or more particular nanostructures, such as lamellar or cylindrical formations, arranged in the film in desired positions and/or orientations. The film may be chemically and structurally periodic, therefore providing suitable structures for more selective and versatile nanopatterned surfaces.

In one aspect of the invention, a block copolymer may be phase separated in the presence of a solvent. The solvent may be crystallizable and crystallization of the solvent may influence the position and/or orientation of molecules in the block copolymer.

In another aspect of the invention, a block copolymer having a boiling point greater than 50° C. may be dissolved in a solvent, and phase separation of the block copolymer in the solvent may be caused.

In another aspect of the invention, a block copolymer, dissolved in a solvent, may be phase separated and the solvent removed via sublimation.

In another aspect of the invention, a block copolymer may be phase separated in a pattern including a plurality of regions in which the block copolymer is segregated in a first orientation and intervening regions in which the block copolymer is segregated in a second, different orientation. The copolymer may be segregated uniformly in the first orientation in and segregated in a second, uniform orientation in the second regions and the system is substantially free of defects at grain boundaries.

In another aspect of the invention, a film including a pattern of nanostructures includes components of a block copolymer phase separated by at least one of directional solidification and epitaxy to form a pattern including a plurality of microdomains. A first set of microdomains may include a first component of the block copolymer forming a first structure type having a first orientation, and a second set of microdomains may include a second component of the block copolymer forming a second structure type having a second orientation. The first and second sets of microdomains may be periodically oriented spatially (e.g., microdomains in a set may be spaced from each other at approximately a same distance) and regularly oriented directionally (e.g., microdomains in a set may all be oriented in a same way).

As used herein, orientation of a microdomain refers to the orientation of structures formed by block copolymer components in the microdomain.

Other advantages, novel features, and objects of the invention will become apparent from the following detailed description when considered in conjunction with the accompanying drawings, which are schematic and which are not intended to be drawn to scale. In the figures, each identical, or substantially similar component that is illustrated in various figures is represented by a single numeral or notation. For purposes of clarity, not every component is labeled in every figure, nor is every component of each embodiment shown where illustration is not necessary to allow those of ordinary skill in the art to understand aspects of the invention.

BRIEF DESCRIPTION OF THE DRAWINGS

FIG. 12a–e are schematic diagrams depicting the evolution of the structure during the unidirectional eutectic solidification and epitaxial crystallization of the block copolymer from the crystallizable solvent wherein;

FIG. 12a is a schematic diagram showing homogeneous solution of PS/PE in BA between two substrates;

FIG. 12b is a schematic diagram showing directional solidification of crystals of α-BA coexisting with a liquid layer of more concentrated polymer;

FIG. 12c is a schematic diagram showing a second directional solidification, showing the eutectic liquid layer transforming into BA crystal, which grows on the pre-eutectic α-BA crystal and an ordered lamellar block copolymer (β);

FIG. 12d is a schematic diagram showing that because of the highly asymmetric composition of the block copolymer and the epitaxial crystallization of the PE in contact with the BA substrate, the flat interfaces of parallel and vertically oriented lamellae are unstable and spontaneously deform in order to achieve a more preferred interfacial curvature and allow epitaxial growth of PE;

FIG. 12e is a schematic diagram showing the layers transforming into an array of vertically oriented, hexagonally packed semicrystalline PE cylinders, a single chain folded PE lamellae is formed in each cylinder and the PE crystals have their (100) planes contacting the (001) plane of the BA crystal with $a_{BA}//c_{PE}$ and $b_{BA}//b_{PE}$;

DETAILED DESCRIPTION

Figure 1:
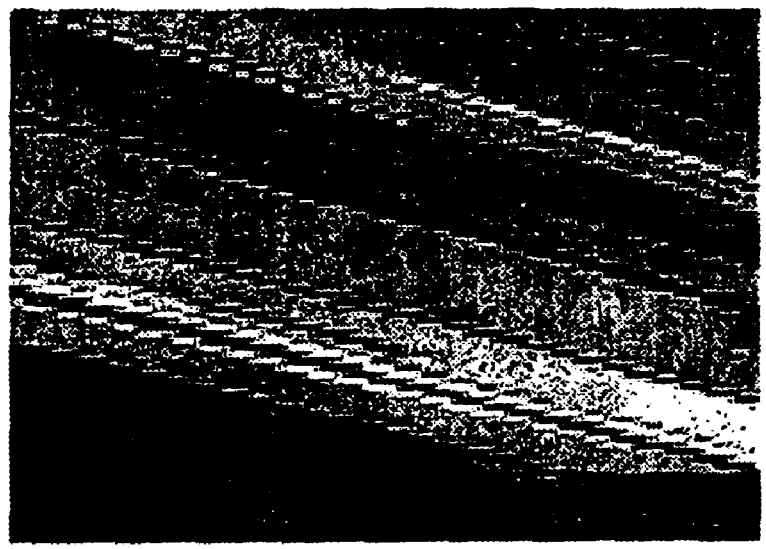
FIG. 1 is a copy of a polarized optical microscope image of directionally crystallized BA crystals wherein the large, flat and elongated BA crystals are aligned with the b axis parallel to the growth front direction.

In accordance with one aspect of the invention, block copolymers, whether amorphous or semi-crystalline, can be rapid solidified from a crystallizable solvent to control both the molecular and the microdomain orientation in thin films of the block copolymer. Depending on the nature of block copolymer and on the properties of the solvent, such as its melting temperature ($T_m$), crystalline structure, the fast growth direction of the crystals, and the epitaxial relationship between the block copolymer (if any) and the crystallizable solvent, variously patterned surfaces may be made. The solidification process may involve two driving forces, i.e., (1) directional solidification and/or (2) epitaxy that produce oriented microdomains via crystallization of the solvent. The two types of interactions, whether alone or in combination, may determine the kinetically-driven microstructures formed.

A variety of crystallizable solvents may be used, including benzoic acid and any of a wide variety of its derivatives, anthracene and its derivatives, naphthalene and its derivatives, and the like. Those of ordinary skill in the art are aware of a wide variety of crystallizable solvents that can be used in accordance with the invention. As will also be appreciated by those of skill in the art, the solvent used may be selected based on various criteria, including the block copolymer to be used and the desired structures to be formed. One selection criteria may be the shape and/or orientation of crystals formed by the solvent. A lattice match between the solvent crystals and crystals formed by one or more components of the block copolymer may be desirable to obtain a suitable arrangement for crystal nucleation and/or growth. Solvents that form plate-like crystals have been found suitable, but solvents that form other crystal types may be used depending on the application. It should also be appreciated that not all aspects of the invention require the use of a crystallizable solvent. Instead, other solvent types may be used with some aspects of the invention.

Aspects of the invention provide techniques for phase separation of block copolymers in the presence of high boiling solvents, or high melting solvents, or crystallizable solvents. In at least one embodiment, crystallizable solvents are used that have high boiling points and high melting points. Described in the examples below are a plurality of block copolymers and crystallizable solvents. The invention is not, however, limited to those examples described below. Those of ordinary skill in the art will understand that any of a wide variety of block copolymers and solvents can be used. For example, block copolymers including those described in International Patent Publication No. WO 98/35248 of Fink, et al., incorporated herein by reference.

In another aspect of the invention, an epitaxial relationship between the crystallizable solvent and the block copolymer may be exploited to form desired structures. For example, a pattern of a crystallized solvent may direct the orientation of components of the phase separated block copolymer. This epitaxy may allow phase separation of the block copolymer from the solvent to occur in an orientation-controlled, defect-free manner. In prior art techniques involving phase separation of a block copolymer from a solvent, typically a thin film is formed, the solvent is evaporated, and phase separation occurs resulting in the formation of structures such as cylinders or lamellae oriented in a nonpatterned, random manner. In accordance with an aspect of the invention, however, crystallization of the solvent may guide the phase separation of the block copolymer. The orientation of separated components of the block copolymer and the microdomains and/or structures they form may be controlled by the direction in which the solvent crystallizes, which, in turn, may be controlled by a temperature gradient applied to the solvent.

In another embodiment, directional solidification of a crystallizable solvent may be used to induce ordering of block copolymers. For example, a crystallization front moving through a solution can cause the rapid removal of solvent from the solution at the front and thereby cause one or more components of the block copolymer to separate and form microdomains and/or structures that are oriented in accordance with the direction of fast growth crystallization of the solvent.

The function and advantage of these and other embodiments of the present invention will be more fully understood from the examples below. The following examples are intended to illustrate aspects of the invention, but do not exemplify the full scope of the invention.

EXAMPLE 1

A polystyrene-block-poly(methyl methacrylate), PS/PMMA (26/32), diblock copolymer and a polystyrene-block-polyisoprene diblock copolymer, PS/PI(45/12) were used. The PS/PMMA-(26/32) sample had a total molecular weight of 58,500 g/mol, a polydispersity of 1.06, with PS and PMMA blocks of 26,000 and 32,000 g/mol, respectively. This sample had a bulk lamellar microstructure (evidenced by small-angle X-ray scattering (SAXS): $d_{100}^{lam} \approx 39$ nm, consistent with the 49% volume fraction of the PS block. The PS/PI(45/12) sample had a total molecular weight of 57,000 g/mol with PS and PI blocks of 45,000 and 12,000 g/mol, respectively. Because the volume fraction of the PI block was 24%, the bulk sample had a hexagonally packed cylindrical microstructure of the minority PI component (evidenced by SAXS: $d_{1010}^{cyl} \approx 42$ nm). The PS/PMMA(26/32) was purchased from Polymer Laboratories, while the PS/PI(45/12) block copolymer was supplied by Exxon Research and Engineering. The processing method was based on the use of low molecular weight crystallizable organic solvents such as benzoic acid (BA) and anthracene (AN). The process employed three steps:

(1) Thin films of the block copolymer (~100 nm thickness) were first formed on a carbon-coated coverslip glass, by evaporation of the solvent from a xylene solution (0.1–0.3 wt %);

(2) Crystalline BA or AN powders were then spread over a glass slide, and the coverslip was placed, polymer side down, on the BA or AN and melted at 150 and 240° C., respectively, whereupon the molten BA or AN dissolved the block copolymer. The solution was then supercooled by placing the glass slide on a hot bar, at 110° C. for BA and at 190° C. for AN, to induce directional crystallization of the BA (melting temperature $T_m \sim 123°$ C.) or the AN ($T_m \sim 220°$ C.). Rapid crystallization of BA or AN, at a growth front velocity ~2 mm/s, produced large, elongated crystals with the b axis parallel to the growth front direction. The slide was moved to a position on the hot bar with a temperature of 60° C. (or 140° C.) and held for a minute to complete the crystallization of the BA (or the AN) and then cooled to room temperature.

(3) A razor blade was then used to fracture-open the solidified material (cleavage occurs easily on the (001) BA and AN planes). Ethanol at 50° C. was used to wash away either the BA or the AN. The interior surface of the coverslip is then scored with a knife, and small sections of the carbon film were floated off onto distilled water and placed on transmission electron microscope (TEM) grids.

Some pieces of PS/PMMA(26/32) were exposed to $RuO_4$ for 20 min to stain the PS microdomains, and pieces of the PS/PI(45/12) films were then exposed to $OsO_4$ for 2 hours to stain the PI microdomains. The films were examined by a JEOL 200 CX TEM in bright field mode, operating at 160 kV. Polarized light microscopy of the films after BA or AN removal demonstrates that there is a strong texture, most apparent from some elongated regions of thicker polymeric material which formed between the crystals of the organic solvents. This direction corresponded to the fast growth direction of the BA or AN (the b axis). Fast Fourier transforms (FFTs) were made from the TEM images, using a software program, image SXM. This program performs the FFT and transferred the data on a log scale as a 2 D image.

Figure 2A:
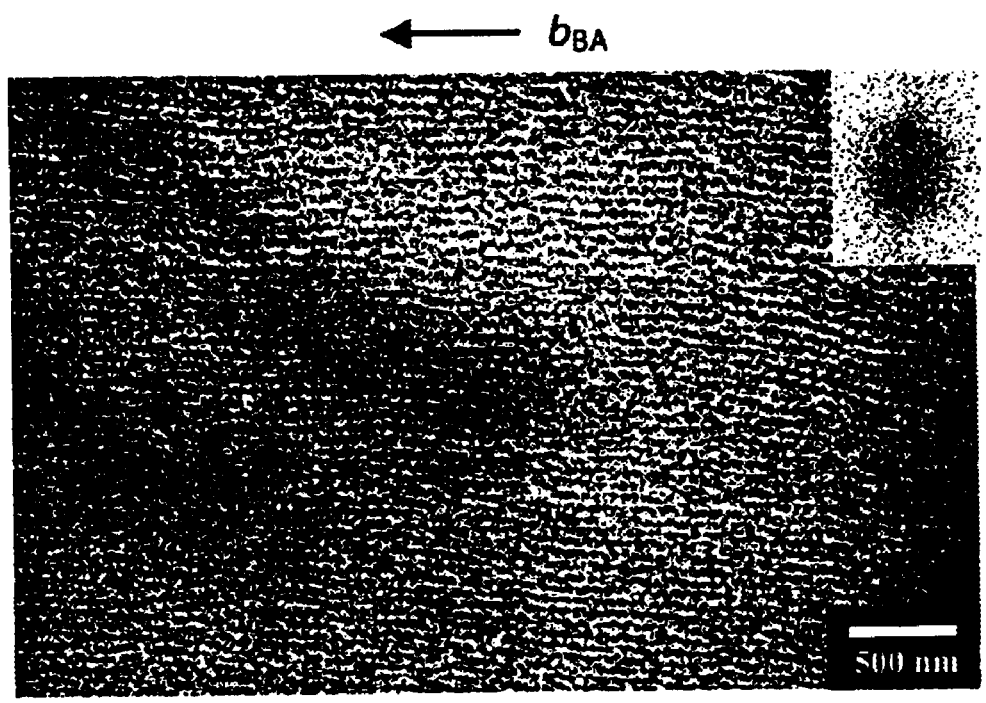
FIG. 2a is a copy of a TEM bright-field image of a thin film of PS/PMMA(26/32) block copolymer with a thickness of approximately 20 nm, directionally solidified with BA, and stained with $RuO_4$ wherein the dark regions correspond to the stained PS microdomains and showing that the lamellae are aligned along the fast growth direction of the BA crystals (crystallographic b axis) and wherein the inset shows the FFT power spectrum of the TEM micrograph.

FIG. 1 shows a polarized optical microscope image of directionally crystallized BA after the rapid crystallization step. Large flat and elongated crystals of BA are seen. A bright field TEM image of a thin film of PS/PMMA (26/32) block copolymer prepared using BA is shown in FIG. 2a. The darker regions correspond to the $RuO_4$-stained PS microdomains. Edge-on parallel lamellae of PS and PMMA appear well-aligned along the fast growth direction of the BA crystals. The PS lamellae appear thicker than the PMMA lamellae because, it is believed, the PMMA microdomains beam damage and shrink under electron irradiation. The well-aligned parallel lamellae appear to extend over regions larger than 50 $\mu m^2$. The FFT power spectrum in the inset of FIG. 2a shows a spotlike first reflection located on the meridian, indicating the nearly single-crystal-like microdomain structure.

Figure 2B:
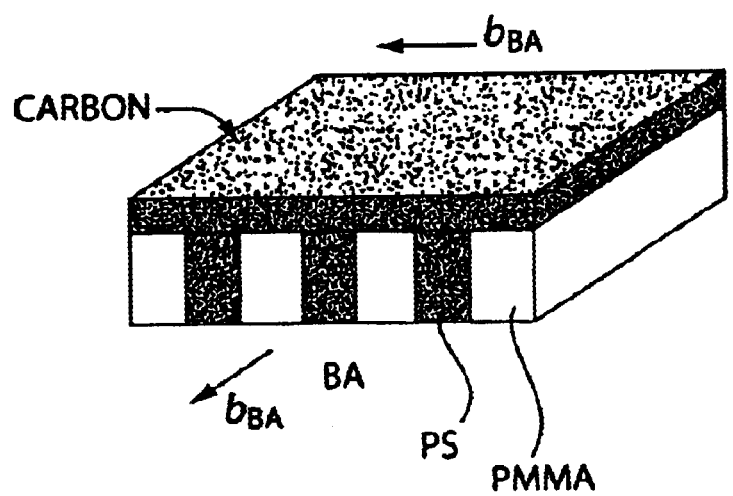
FIG. 2b is a schematic model of the microstructure of PS/PMMA processed with BA. Alternating lamellae of PS and PMMA microdomains are aligned along the b axis of BA crystal.

The schematic model of the microstructure of the PS/PMMA block copolymer, after directional solidification with BA, is shown in FIG. 2b. Vertically alternating PS and PMMA lamellae are believed to be well oriented along the b axis of BA crystal. The fast directional microstructure formation during the phase separation, with a thin film thickness approximately less than a half lamellar period, avoids preferential wetting of one of the blocks on the substrate, leading to the oriented lamellae microdomain structure where the interface of the microdomains is parallel to the normal of the substrate surface. The structure is kinetically driven and subsequently vitrified at room temperature. Importantly, for regions thicker than approximately a half lamellar period, the perpendicular lamellae orientation switches to an in-plane parallel one, and large planar regions (hence no TEM contrast) were produced. Spotlike first reflection, located on the meridian, shows the nearly single crystal micrcostructure.

Figure 3A:
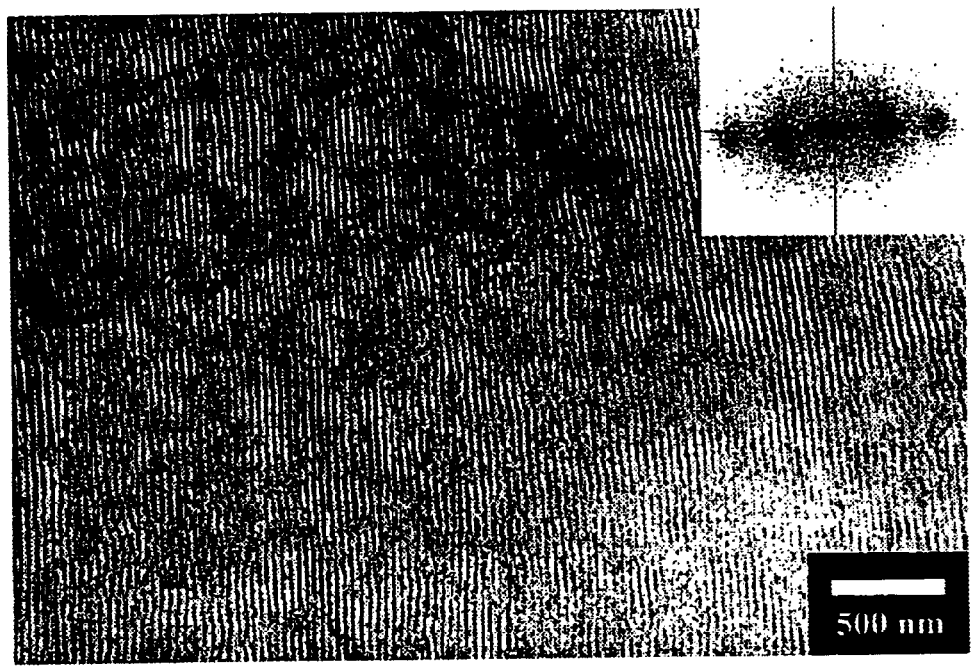
FIG. 3a is a copy of a TEM bright-field image of a thin film of PS/PI(45/12) block copolymer with the thickness of approximately 50 nm, directionally solidified with BA, and subsequently stained with $OsO_4$ showing dark regions which correspond to the stained PI cylinders, and white regions which correspond to the PS matrix and wherein the cylindrical PI microdomains are well-aligned along the fast growth direction of the BA crystals and wherein the inset shows the fast Fourier transform (FFT) power spectrum of the TEM micrograph.
Figure 3B:
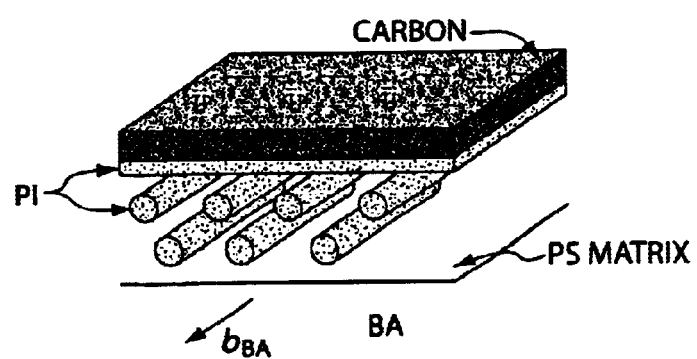
FIG. 3b is a schematic model of the microstructure of PS/PI processed with BA showing cylindrical PI microdomains edge-on to the crystalline substrate and aligned along the b axis of BA crystal.
Figure 4:
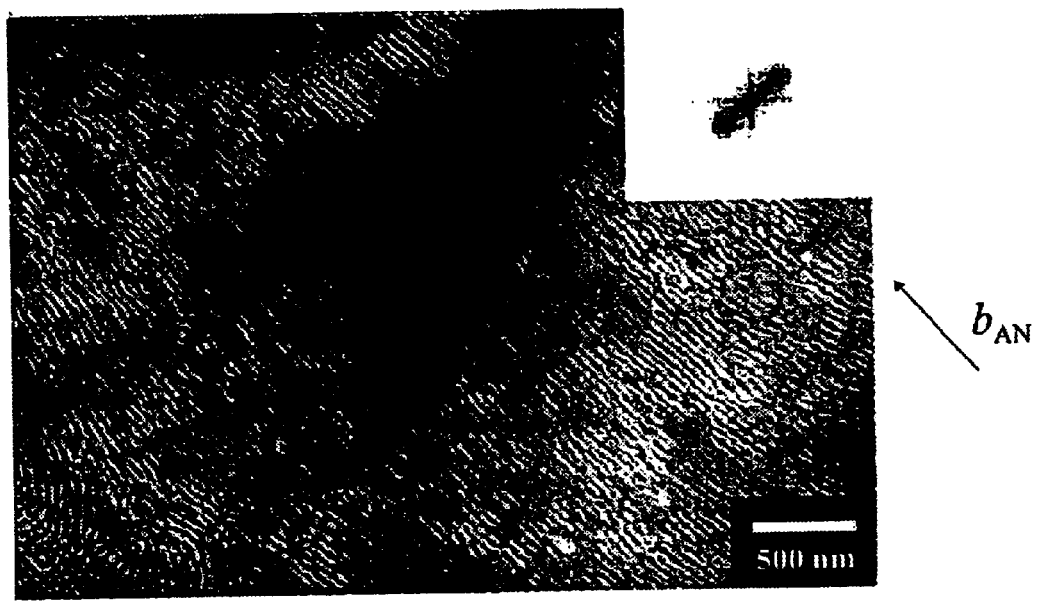
FIG. 4 is a copy of a TEM bright-field image of a thin film of PS/PI(45/12) block copolymer with the thickness of approximately 50 nm, directionally solidified with AN, and stained with OsO$_4$ wherein the dark regions correspond to the stained PI cylinders, while the white regions correspond to the PS domains and showing that the cylindrical PI microdomains are not so well aligned along the fast growth direction of the AN crystals and wherein the inset is the FFT power spectrum of the TEM micrograph.

A bright-field TEM image of a thin film of the PS/PI-(45/12) block copolymer, with a thickness of approximately 50 nm, which was directionally solidified with BA, is shown in FIG. 3a. The darker regions in FIG. 3a correspond to the $OsO_4$-stained PI microdomains. It is apparent that the PI cylinders, lying in-plane, are well-oriented along the crystallographic b axis of the BA. The ordered parallel cylinder structure appear to extend over regions larger than 50 $\mu m^2$. The average diameter of the PI cylindrical microdomains is approximately 20 nm, while the average distance between the cylinders is 40–50 nm consistent with the bulk SAXS data. A schematic model of microstructure of PS/PI block copolymer after directional solidification with BA is shown in FIG. 3b in which in-plane PI cylinders are aligned along the BA b axis. It is believed that the lower surface tension PI block is preferentially at the carbon interface while the PS block forms an interface with the BA surface because of its more favorable interaction. Spotlike reflections, located on the equator at $q_0$ and $2q_0$, indicate a nearly single-crystal-like microstructure. In particular, absence of the x $3q_0$ reflection in this FFT power spectrum demonstrates that there is no rotation and tilting of microdomain lattice along the cylinder axis To confirm that this simple process can be applied with other organic crystallizable solvents, anthracene, which has a melting temperature 100° C. higher than that of benzoic acid, was used. A TEM bright-field image of a thin film of the PS/PI(45/12) block copolymer, directionally solidified with AN, is shown in FIG. 4. A microstructure similar to that obtained with BA is observed. The cylindrical PI microdomains are again aligned along the fast growth direction of AN crystals. However, in terms of the perfection of ordering, the microstructure produced with AN is much more defective with many more dislocations than when BA is used. The FFT power spectrum of FIG. 4 (inset) shows only one arced reflection, whereas the FFT power spectrum of FIG. 3a (inset) shows spotlike multiorder reflections perpendicular to the cylinder axis of PI microdomains. It is believed that this decrease in microdomain ordering is due in part because the shape anisotropy of the AN crystals is lower than that of BA crystals.

The mechanism of pattern formation in the block copolymer induced by the crystallizable solvent is related to that for a semicrystalline block copolymer. One difference is that, for the present noncrystalline block copolymer materials, only the effect of directional solidification is involved. The aspects of overall phase transformation can be understood assuming the possible formation of an eutectic mixture of the block copolymer and the crystallizable solvent. In a hypothetical solvent-polymer phase diagram an eutectic may be present due to the intersection of the melting point depression liquidus curve of the crystallizable solvent and the microphase separation transition depression liquidus curve of the block copolymer. The initial homogeneous solution confined between the glass substrates transforms due to the imposed directional solidification into large crystals of BA (or AN) having (001) surfaces coexisting with a thin liquid layer near the eutectic composition. Dropping the temperature further then causes this layer to also directionally solidify by thickening the preexisting (BA or AN) crystal with simultaneous formation of a thin, metastable vertically oriented lamellar microdomain film. In the case of the PS/PMMA block copolymer, the vertical lamellar structure is vitrified due to the high glass transition temperatures of both blocks. In the case of PS/PI block copolymer with a low volume fraction of PI block, however, it is hypothesized that the vertical lamellar microstructure is transformed into in-plane cylindrical microstructure due to the interfacial instability of thin lamellae, film thickness, and preferential wetting of PI block.

An interesting possibility to achieve vertically aligned cylinders is to employ ultrathin films of a cylinder-forming block copolymer. As first shown by van Dijk and van den Berg, the cylindrical microdomains orient vertically for relatively thin film due to incommensurability effects, which is similar to what observed for lamellar diblock copolymers. An initially thinner PS/PI film (approximately 20 nm thickness) prepared from a more dilute solution probably first forms a thin metastable vertically oriented lamellar film which undergoes a vertical undulation instability, resulting in a vertically aligned cylindrical structure.

Figure 5:
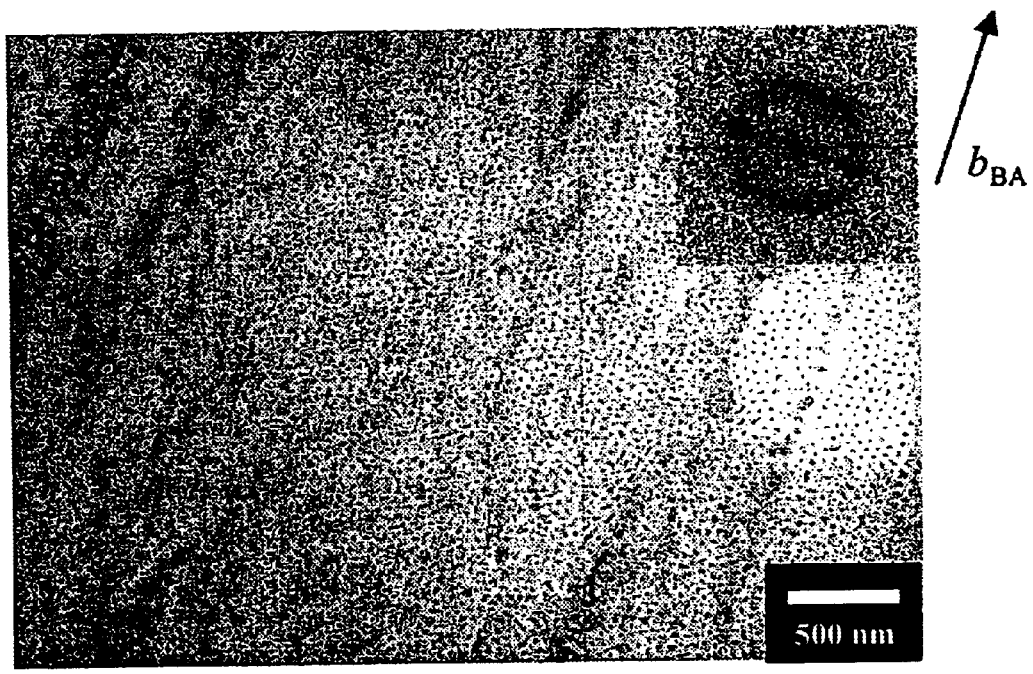
FIG. 5 is a copy of a TEM bright-field image of a thin film of PS/PI(45/12) block copolymer with the thickness of approximately 20 nm, directionally solidified with BA, and stained with OsO$_4$ wherein the dark regions correspond to the stained PS microdomains and showing vertically oriented PI cylinders aligned along the fast growth direction of the BA crystals (crystallographic b axis) and wherein the inset shows the FFT power spectrum of the TEM micrograph.

FIG. 5 shows a bright-field TEM image of PS/PI (45/12) block copolymer directionally solidified with BA and stained with $OsO_4$. The dark $OsO_4$-stained vertically aligned cylindrical PI microdomains are oriented into rows along the b axis of BA crystal. The aligned vertical cylinder extend over regions larger than 50 $\mu m^2$. The FFT power spectrum in the inset of FIG. 5 shows spotlike first reflections with 6-fold symmetry, indicating approximate hexagonal packing of the PI microdomains.

Several noncrystalline block copolymers with various molecular weights, compositions, and architectures were also directionally crystallized using BA. In general, improved orientation is achieved with higher PS-containing block copolymers probably because of better solubility of the PS block in BA. At high PI block content, the block copolymer film dewets on the glass substrate after removal of BA at room temperature.

Orientation of block copolymer microdomains via directional crystallization of a solvent is an effective way to develop unidirectional long-range ordering of conventional amorphous block copolymers. The orientation of microdomains occurs within a few seconds without any long time annealing procedures.

EXAMPLE 2

A polystyrene-block-polyisoprene diblock copolymer, denoted PS/PI(45/12) having a PS block of 45,000 g/mol and a PI block of 12,000 g/mol was used. The copolymer has a bulk microdomain structure that had hexagonally packed, cylindrical PI domains with an intercylinder distance ($d_0$) of 48 nm and cylinder diameters of 20 nm. The block copolymer was supplied by Exxon/Mobil Research.

Figure 6A:
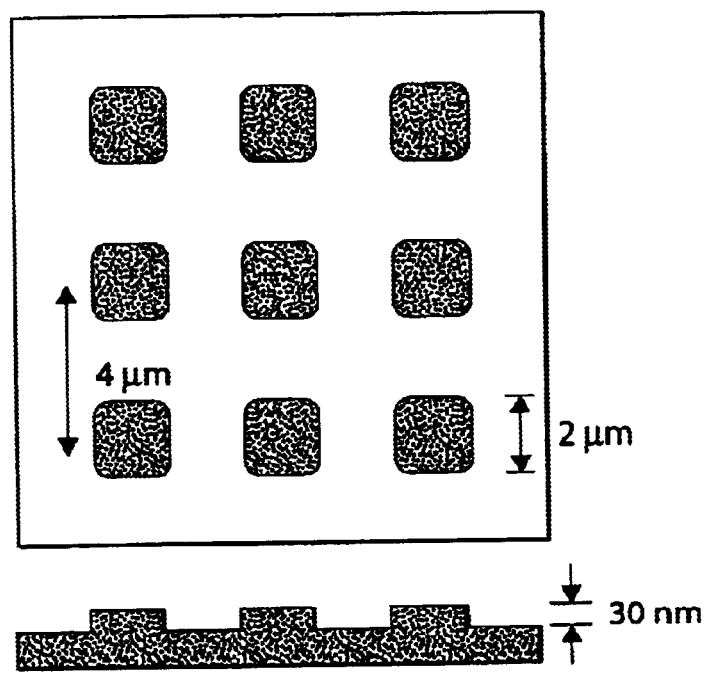
FIG. 6a is a schematic of the topographically patterned silicon oxide substrate.

The patterned substrate was produced via standard lithographic techniques. The substrate pattern had 30 nm high, 2 micron×2 micron square mesas arranged in a square array with a 4 micron spacing as shown in the schematic diagram of FIG. 6a. The square-shaped mesas are made by selective etching of a thermally grown silicon oxide on a 4 inch wafer.

The topography of the patterned substrate produced thickness variations in the directionally solidified block copolymer thin films. It is believed that the thickness variations resulted from the copolymer confinement between the flat BA single crystal and the topographically patterned substrate. Polarized light microscopy of the films after BA removal showed axial texture, along the fast growth direction of the BA (the b-axis). To control the microdomain pattern, both with respect to the normal to the substrate and with respect to the in-plane lattice vectors of the square mesa array, the direction of the BA crystal growth was aligned approximately parallel to one of the lattice basis vectors.

Samples for transmission electron microscopy (TEM) were prepared by subliming the BA and then carbon coating the thin block copolymer film formed on the patterned substrate. Subsequently, small sections of the carbon and polymer films were detached from the substrate employing polyacrylic acid (PAA) solution. After dissolution of the PAA, film sections were picked up by TEM grids and then exposed to $OsO_4$ for 2 hours to stain the PI microdomains. The films were then examined in a JOEL 200 CX TEM in bright field mode, operated at 160 kV.

Another block copolymer film was similarly directionally solidified on the patterned substrate and after sublimation of the BA was subjected to $O_2$-RIE to selectively remove the cylindrical PI microdomains. $O_2$-RIE was performed on a Plasma Therm Model 790 plasma etcher using 10 mtorr of $O_2$ at 75 Watts for 15 seconds. This film was examined with a Nanoscope III atomic force microscope (AFM) in tapping mode. Fast Fourier Transforms (FFTs) were made from the AFM images, using the software program, Image SXM. In addition, scanning electron microscopy (SEM) was used to image the sample in secondary electron image (SEI) mode after coating with 10 nm of Cr with a JEOL 330 Field Emission SEM operated at 5 kV.

Figure 6B:
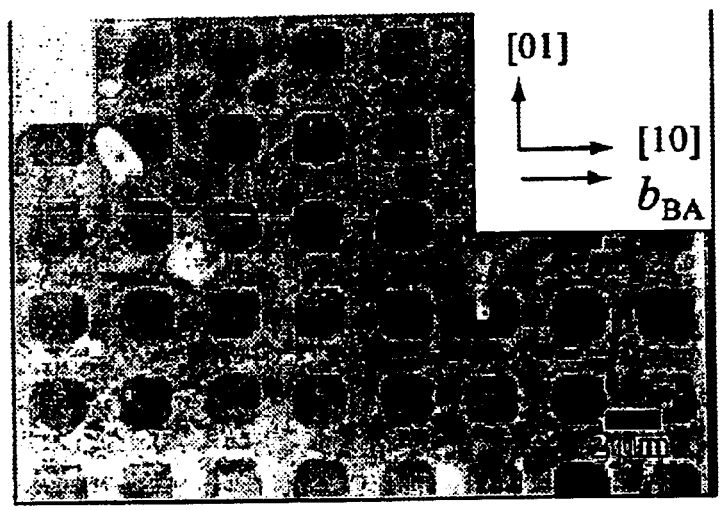
FIG. 6b is a copy of a bright field TEM image of a thin film of PS/PI(45/12) block copolymer, directionally solidified with BA on the pre-patterned substrate. The low magnification image depicts a typical region larger than 1000 □m2 where the cylindrical PI microdomains are aligned via directional solidification. The replicated micron scale pattern structure is seen due to different film thicknesses in the two types of regions. Inset shows the basis vectors of the cylindrical PI microdomain lattice and the fast growth direction of the BA crystal (b axis)

A low magnification bright field TEM micrograph of a detached film is shown in FIG. 6b. The pre-patterned substrate structure has been replicated into the block copolymer film and is visible in TEM due to amplitude mass contrast from the film thickness differences. As expected, the films appear thinner on the mesas and thicker in the plateau regions.

Figure 7A:
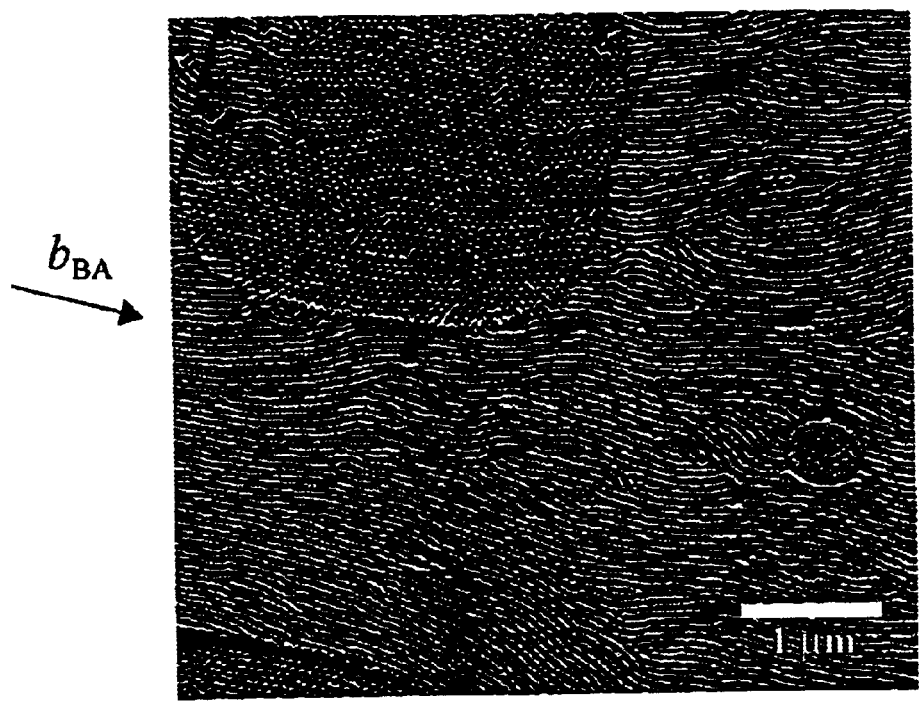
FIG. 7a is a copy of a tapping mode, amplitude contrast AFM image of a thin film of PS/PI(45/12) block copolymer, directionally solidified with BA on the pre-patterned substrate and subsequently etched by O$_2$-RIE, showing that the cylindrical PI microdomains with two different orientations with respect to the substrate are well aligned along the fast growth direction of the BA crystals as indicated by an arrow. The square-shaped mesa regions exhibit vertically oriented, hexagonally packed PI cylinders. The plateau regions exhibit in-plane PI cylinders

A higher magnification AFM image after $O_2$-RIE is shown in FIG. 7a. This image, taken in amplitude contrast mode, revealed the double orientation of the cylindrical PI microdomains. After $O_2$-RIE, the center to center spacing of both vertically aligned and in-plane cylinders was found to be approximately 48 nm, which is comparable to that in the bulk. In the thicker film regions (approximately 50 nm thick), as determined from height contrast images of a damaged film region prior to $O_2$-RIE, cylindrical PI microdomains appear well aligned along the b axis of the BA crystal with the cylinder axis parallel to the substrate and to the walls of the mesas. In the thinner film regions (approximately 20 nm), the PI cylinders are hexagonally packed with their cylinder axes perpendicular to the substrate and with the $\vec{a}_1$ lattice direction parallel to $\vec{b}_{BA}$ (i.e. along the [10] direction of the square substrate pattern).

Figure 7B:
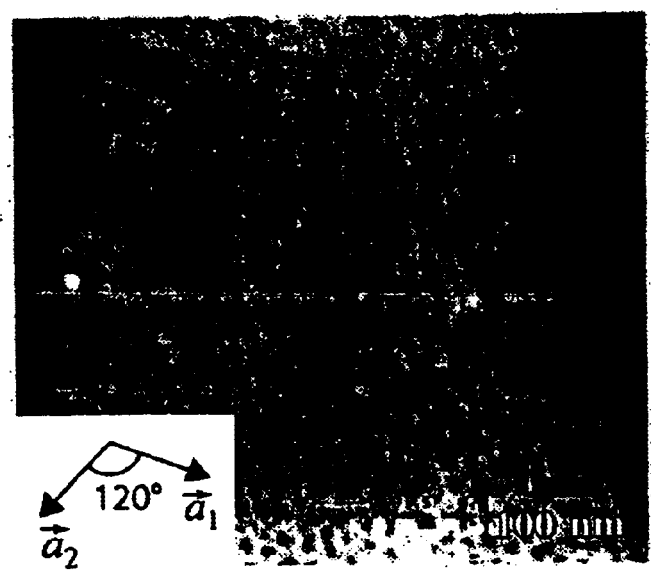
FIG. 7b is a copy of an SEM image of a thin film of PS/PI(45/12) block copolymer, directionally solidified with BA on the pre-patterned substrate and subsequently etched by O$_2$-RIE, showing in SEI contrast mode reveals similar microdomain orientations; laterally aligned PI cylinders successively transform their in-plane to vertical orientation with respect to the substrate; the two hexagonal lattice directions of the vertically ordered PI cylinders are shown in the inset.
Figure 7C:
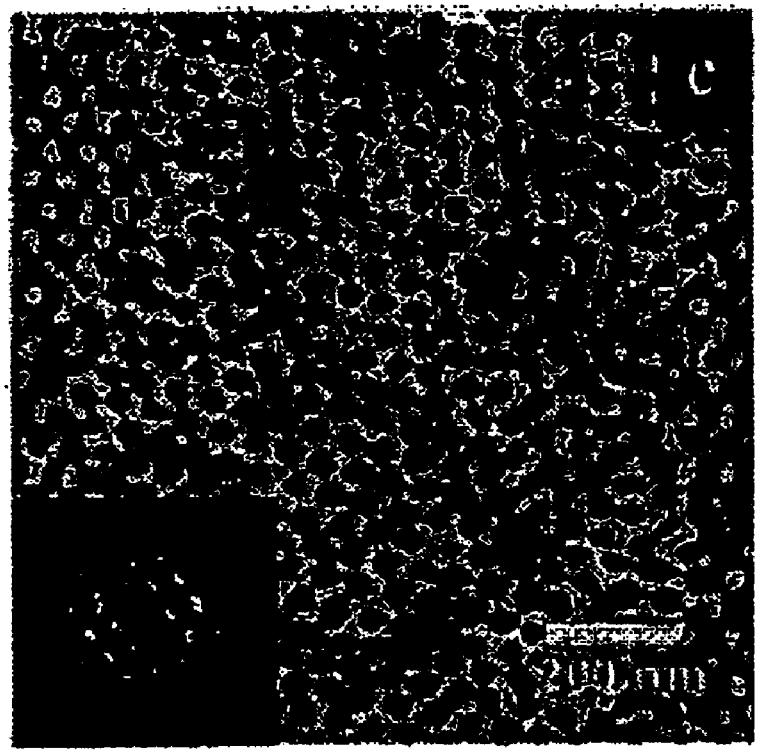
FIG. 7c is a copy of height mode AFM image of a thin film of PS/PI(45/12) block copolymer, directionally solidified with BA on the pre-patterned substrate and subsequently etched by O$_2$-RIE, showing that on a mesa region that vertically ordered cylindrical PI microdomains are selectively removed by O$_2$-RIE, appearing dark, wherein the inset is the FFT power spectrum of the square-shaped mesa region.

The SEM image in FIG. 7b shows that the microdomains successively transform from parallel to vertical when they go from the plateau into the mesa regions. The in-plane PI cylindrical microdomains aligned along the b axis direction of the BA crystal in the plateau regions transform abruptly into hexagonally packed, vertically oriented cylinders. The cylindrical hole structures on the mesa areas after $O_2$-RIE are also shown in FIG. 7c in height contrast AFM, wherein multiple orders of 6 fold symmetry reflections are seen, confirming a hexagonal packing of PI cylinders on the mesa region and several point defects are seen, but no grain boundaries are observed. Independent $O_2$-RIE experiments on homopolymers of PS and PI indicate that, under equivalent etching conditions, a 20 nm thick PI film is completely removed, while approximately 75% of a 20 nm thick PS film remains, yielding an approximate etch ratio of PI to PS of 4. Thus, the vertically ordered PI cylindrical domains on the mesa regions appear to be essentially empty. On the plateau regions, however, only the top layer of PI microdomains was modified, leaving the bottom wetting interfacial layer intact. Block copolymer film thickness appear to be crucial in determining the orientation of cylindrical microdomains with respect to the substrate.

Figure 8A:
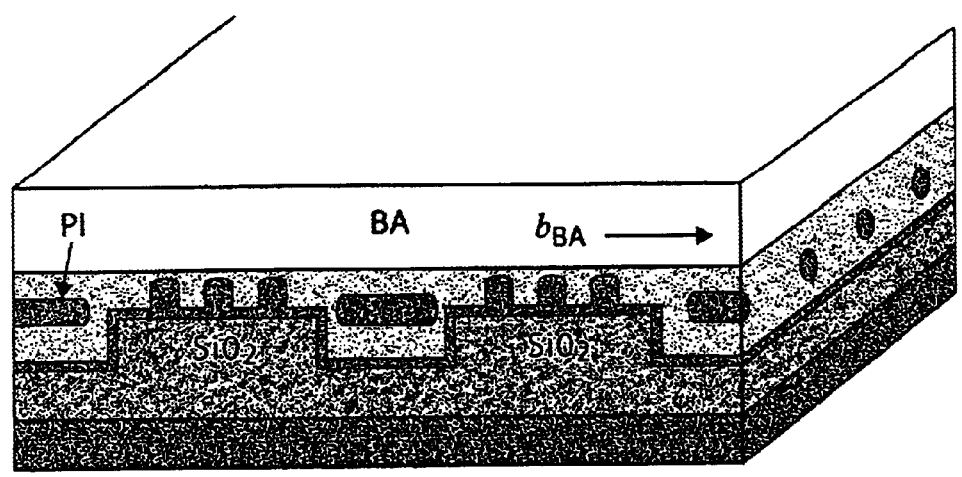
FIG. 8a is a schematic diagram of the PS/PI block copolymer microstructure, directionally solidified on the patterned substrate, before O$_2$-RIE, wherein block copolymer films confined between the BA crystal and the pre-patterned substrate undergo thickness variations, leading to two different orientations and preferential PI and PS wetting on silicon and BA surface are assumed respectively.
Figure 8B:
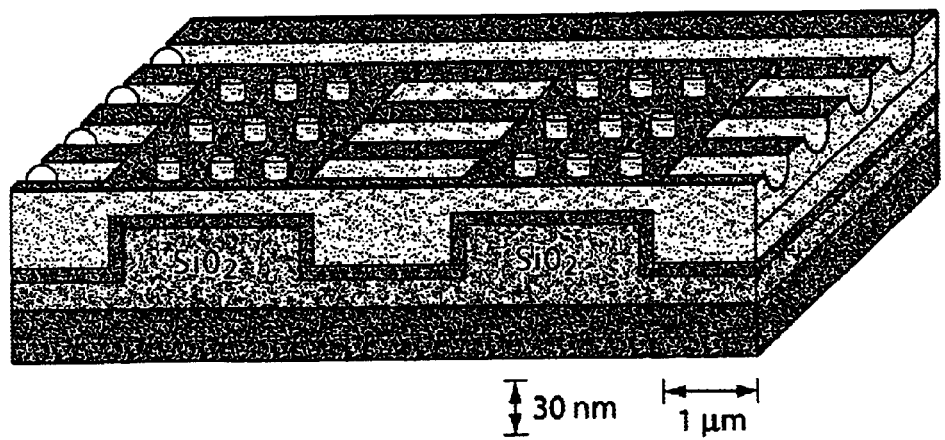
FIG. 8b is a schematic diagram of the PS/PI block copolymer microstructure, directionally solidified on the patterned substrate, after O$_2$-RIE. Note the difference in magnification between the vertical and in-plane directions, wherein the O$_2$-RIE generates a vertically ordered cylindrical hole structure on the mesa regions and on the plateau regions, the original film thickness is reduced by approximately 15%, so only part of cylindrical PI layer is modified due to limited etching.

Fasolka et al. in *Macromolecules*, 33, 5702 (2000), demonstrated in their 2D self-consistent field analysis of lamellar forming diblock copolymers confined between walls of different interfacial energies (i.e., different chemistry) that for films in the thickness range $t \leq 0.5$ $L_0$ (lamellar period), vertically oriented morphologies are predicted when one block preferentially wets both interfaces, while for systems where each block preferentially wets one interface, a vertical orientation is predicted for $0.5L_0 < t \leq L_0$. For this system, the thin regions of film (mesa regions) had a thickness $t \approx 0.5$ $d_0$, suggesting upon first consideration that this anti-symmetric wetting system (PI at silicon substrate, PS at BA interface) should exhibit a half-cylinder morphology in a parallel orientation. However, if the minority PI block is strongly preferred at the substrate, the equilibrium morphology could instead shift to a half-lamellar structure, with an effective period $L_0$,eff~0.8 $d_0$. In this case, one could display a vertically oriented morphology, consistent with the behavior seen for lamellar systems described above. In the plateau regions of the film, a full cylinder layer in parallel orientation would sit atop this half-lamellar layer, with an ideal thickness t0~1.4 $d_0$, slightly thicker than the measured film thickness. Perspective schematics of the morphology before and after $O_2$-RIE are shown in FIGS. 8a and b.

In summary, directional solidification of the block copolymer, combined with topographically mediated substrate patterning can provide a fabrication method with sufficient bias to uniquely control the microdomain symmetry. The overall pattern can have the greatest common symmetry (2 mm) of the directional solidification, substrate (4 mm) and cylindrical microdomains (6 mm). This method can induce two types of domain orientation in precise lateral patterns: control over the position and orientation of cylindrical domains on the patterned substrate provides nanolithographic templates for micromagnetics and microphotonics.

EXAMPLE 3

A polystyrene-block-polyethlylene (PS/PE) diblock copolymer, which was prepared by hydrogenation of polystyrene-block-1,4-butadiene, previously synthesized via sequential anionic polymerization as described by Morton et al. in Anionic polymerization of vinyl monomers, J. *Rubber Chem. Tech*. 48, 359 (1975) was used. The amorphous PS block and the crystallizable PE block had molecular weights of 40,000 and 10,000 g/mol respectively. The volume fraction of the PE block was 0.24 with a melting point of 98° C. Near the eutectic temperature, the block copolymer is in the intermediate segregation regime. SAXS of bulk films of PS/PE showed multiple low angle reflections characteristic of hexagonally packed cylinders with the first Bragg peak at q=0.15 nm$^{-1}$ corresponding to a cylinder-cylinder spacing of 42 nm.

Figure 9A:
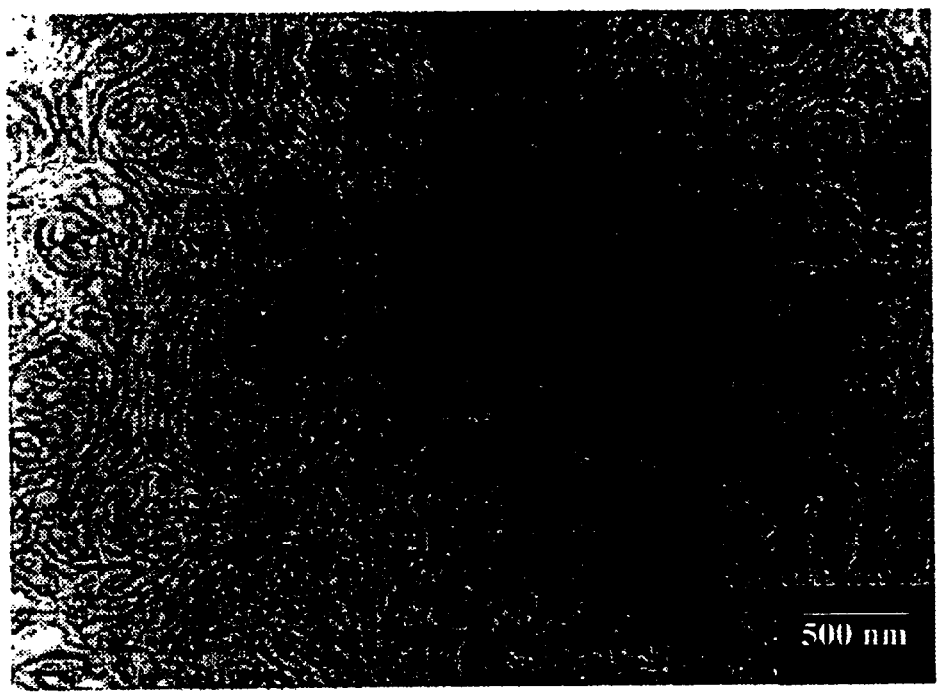
FIG. 9a is a copy of an TEM micrograph of simple cast and directionally solidified and epitaxially crystallized block copolymers wherein the solvent cast thin film of PS/PE block copolymer is stained with RuO$_4$.

When cast from dilute xylene solution (0.3 wt %) onto an amorphous carbon support film, the structure consisted of in-plane meandering cylinders of PE in the PS matrix as shown in FIG. 9a. The lighter regions correspond to the polyethylene domains, the gray regions to the PS matrix. Darker regions appear due to island areas of greater film thickness.

To control the PS/PE microdomain and crystalline PE structures, benzoic acid was used as a crystallizable solvent onto which polyethylene homopolymer which is known to epitaxially crystallize. The processing procedure started with the deposition of a thin, ~50–100 nm, film of the PS/PE copolymer from xylene at room temperature onto a carbon coated coverslip glass. Crystalline benzoic acid powder was then spread over a glass slide, the coverslip was placed, polymer side down, on the benzoic acid and the assembly was heated to 150° C. whereupon the benzoic acid melted and dissolved the block copolymer.

The solution was then supercooled by placing the glass slide on a hot bar at 110° C. and contacting the edge of the coverslip with tweezers to induce crystallization of the benzoic acid ($T_c \approx 120°$ C.). Rapid crystallization of the BA occurred with a growth front velocity≈2 mm/sec thus resulting in large, elongated crystals with the b axis parallel to growth front direction.

Finally the slide was moved to a position on the hot bar having a temperature of 60° C. and held for a few minutes to complete the crystallization of the BA and the PE, then cooled to room temperature. A razor blade was used to fracture-open the solidified material (cleavage occurs easily on the (001) BA planes). Ethanol at 50° C. was used to wash away the BA from the coverslip.

The interior surface of the coverslip was scored with a knife and small sections of the carbon film were floated off onto distilled water and picked up by TEM grids. Some sections were exposed to $RuO_4$ to stain the PS regions. The films were examined by transmission electron microscopy (TEM) in bright and dark field as well as in selected area electron diffraction.

Figure 9B:
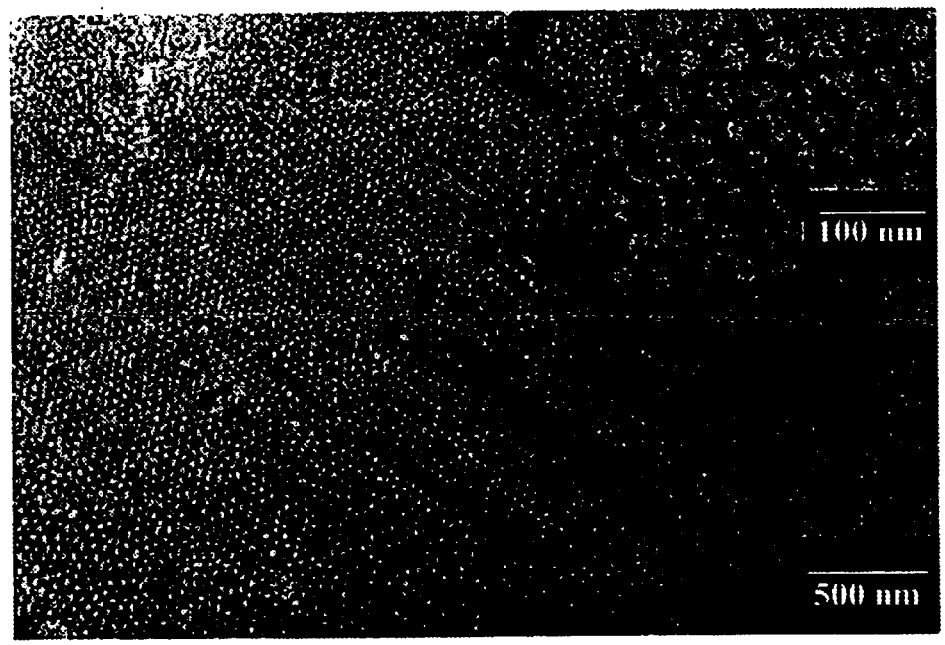
FIG. 9b is a copy of a TEM micrograph of simple cast and directionally solidified and epitaxially crystallized block copolymers with uniform thickness well ordered thin film of PS/PE block copolymer formed by directional solidification of a solution of the block copolymer in benzoic acid.

Polarized light microscopy of the films after BA removal showed that a strong texture, most apparent from some elongated regions of thicker polymeric material which formed between the BA crystals. Notably, this direction corresponds to the fast growth direction of the benzoic acid, the b-axis. A bright field image of the $RuO_4$ stained film showed well ordered arrays of light, unstained PE domains in a dark stained PS matrix as shown in FIG. 9b. The light domains appear to be packed on a hexagonal lattice with good long range order extending over 20 micron diameter areas. The domain packing appeared pseudo-hexagonal with an interdomain spacing of 40 nm along the b-axis direction of BA, and about 10–15% smaller along the other 2 directions. The bright field TEM image shows a poorly ordered microphase separated structure. The dark regions correspond to the stained PS matrix, while the white regions correspond to the semi-crystalline The PE component forms cylinders oriented perpendicular to the film surface and packed in a pseudo-hexagonal lattice. Inset: Magnified region of FIG. 1b showing the noncircular shape of the PS-PE interface.

Tilting the film in the TEM demonstrates the light domains are cylindrical shaped rather than spherical. Close inspection of magnified images showed that the shape of the interface between the PS and PE was non-circular (see image inset). The diameter of the PE domains along the b direction was about 50% larger on average than in the perpendicular direction (30 nm vs. 20 nm).

Figure 10A:
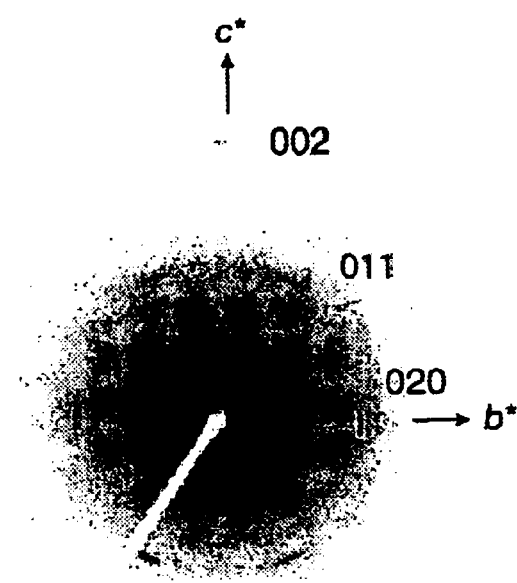
FIG. 10a is a copy of a diffraction patterns and dark field image of directionally solidified and epitaxially crystallized block copolymer showing selected area electron diffraction pattern of an unstained film of PS/PE block copolymer crystallized from benzoic acid demonstrating epitaxy.

An electron diffraction pattern from an unstained film in FIG. 10a showed well oriented near-single crystal like reflections which indexed to the (0kl) reciprocal lattice section of orthorhombic polyethylene (space group $Pna2_1$). The (020) reflection of the PE appears to lie along the BA b-axis direction and with the (002) PE chain axis reflection along the perpendicular direction. This corresponds to the known epitaxy between homopolyethylene and BA, namely the (100) plane of PE is in contact with the (001) plane of BA, with the b and c axes of PE parallel to the b and a axes of BA respectively. Considering the sample had a total bulk crystallinity of less than 10%, such an diffraction pattern may be due to the extraordinary alignment into the diffraction condition of nearly all of the crystals within the selected area as well as the enhancement of crystallinity by the substrate. The pattern exhibits only 0 kl reflections of PE, which indicates that the (100) plane of PE is normal to the electron beam and parallel to the (001) face of the benzoic acid crystals. The c and b axes of the PE crystals are parallel to the a and b axes of the benzoic acid crystal.

Figure 10B:
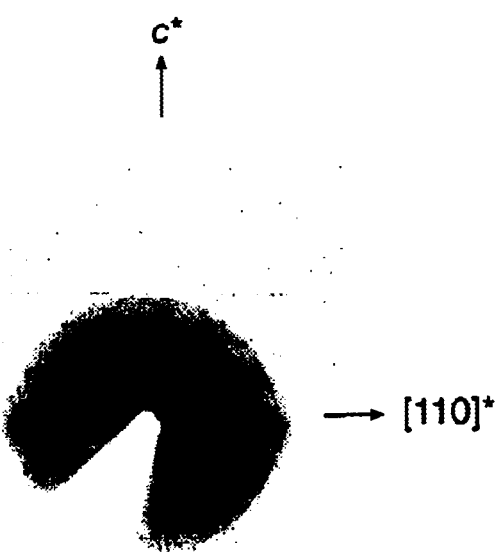
FIG. 10b is a copy of a diffraction pattern from a similar sample after tilting 34° about the chain axis direction of PE showing the strong (110) diffraction peaks of polyethylene.
Figure 10C:
FIG. 10c is a copy of a dark field image of the PS/PE film using the (110) diffraction spot showing small rectangular PE crystals are observed well aligned along the b axis direction of the BA crystals and packed on a pseudo-hexagonal lattice whose size and orientation is the same as seen in FIG. 9b.

The PE crystals can be visualized with dark field imaging employing a rotate-tilt stage to bring the strongest diffracting (110) planes into the Bragg condition as shown in FIG. 10b. Low dose imaging at a magnification of 3,000× showed a periodic array of small rectangular shaped crystals well aligned along the [110]* direction as shown in FIG. 10c. The crystals appear to be arranged in a pseudo-hexagonal lattice whose orientation and average center to center spacing correspond with the orientation and spacings of the cylindrical PE domains observed in the $RuO_4$ stained BF image. In this projection, the PE crystals are 7 nm thick by 20 nm long with their longest dimension parallel to [110]*. Their size and spacing suggest there is precisely one crystalline PE lamellae approximately centered in each cylindrical microdomain and with the b axis of the lamellae oriented parallel to the b axis of the BA. The DF image thus confirms the epitaxy of PE on BA demonstrated by the electron diffraction pattern. This information also shows that the minority PE component was in direct contact with the BA crystals and hence is present at least at the BA-facing surface of the thin film. The longest dimension of the crystals is along the b axis and parallel to the longest diameter of the noncircular interface of the PE domain. This suggests that during crystallization, the anisotropic growth of the crystallizing lamellae deforms the microdomain interface.

Figure 11:
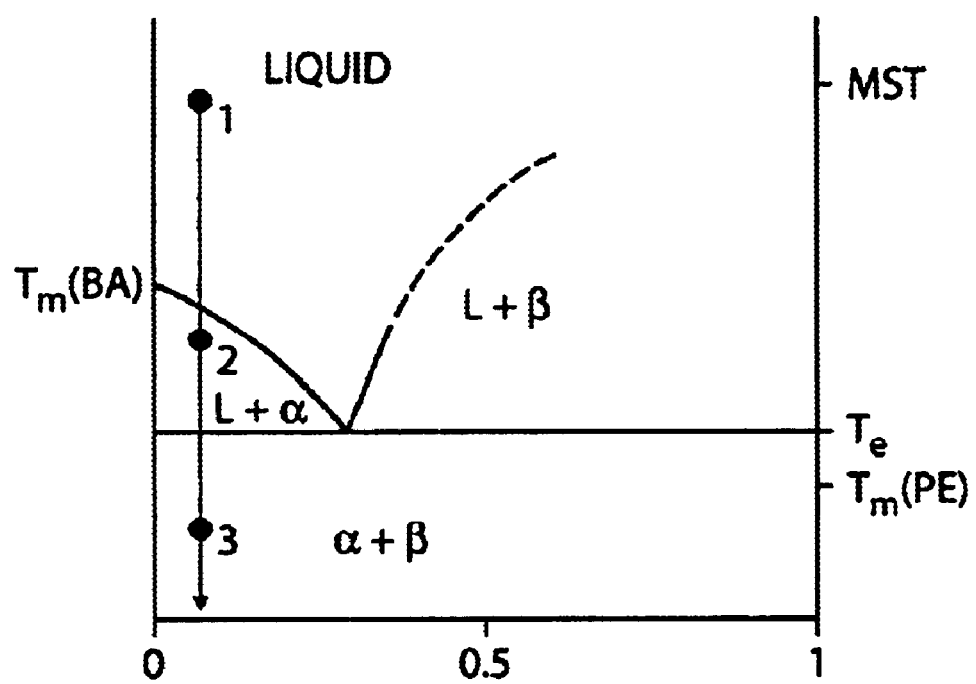
FIG. 11 is a hypothetical phase diagram of the benzoic acid-PS/PE block copolymer system showing the melting points of benzoic acid ($T_m$ (BA)) and polyethylene ($T_m$ (PE)) as well as the microphase separation transition temperature of the PS/PE block copolymer (MST) and the eutectic point and eutectic temperature ($T_e$) and where the dilute polymer solution is cooled from location 1 to 3 during the film formation process.

The essential aspects of the overall phase transformation can be understood by dividing the process into three stages using a hypothetical solvent-polymer phase diagram as depicted schematically in FIG. 11. A feature of the phase diagram is the presence of a eutectic due to the intersection of the melting point depression liquidus curve of the benzoic acid with the microphase separation transition depression curve of the block copolymer. The hypoeutectic system begins as a homogeneous liquid (point 1), the temperature is then dropped below the liquidus and growth of BA crystals is initiated by directional solidification (point 2) which increases the copolymer content of the remaining liquid toward the eutectic composition. Further cooling below both the eutectic temperature and the crystallization temperature of the PE results in the transformation of the eutectic liquid into crystalline BA and an ordered, microphase separated block copolymer within which the PE block crystallizes (point 3).

Figure 12A:
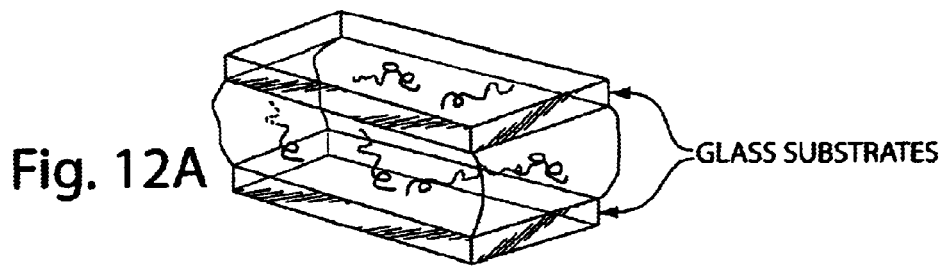
Figure 12B:
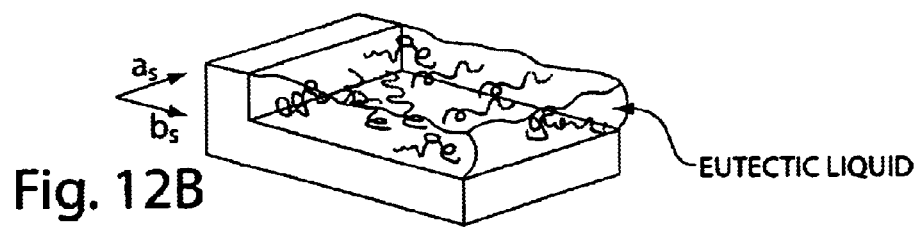
Figure 12C:
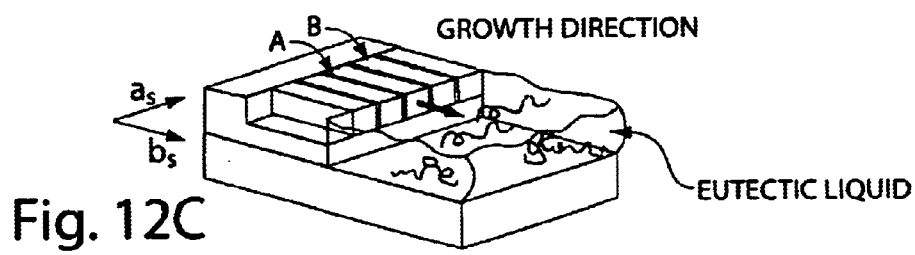

The evolution of the system into the final semicrystalline transversely ordered cylindrical microstructure is schematically depicted in FIGS. 12a–e. The initial homogeneous solution, shown in FIG. 12a, transforms due to the imposed directional solidification into elongated α crystals of BA coexisting with a liquid film near the eutectic composition as shown in FIG. 12b. This film also then unidirectionally solidifies thickening the BA crystal and forming thin, metastable lamellar microdomains as shown in FIG. 12c. This can be understood by noting that in the solution, the spatial distribution of the junction points of the block copolymer molecules is nearly random and upon rapid extraction of the solvent during the second directional solidification process, the junctions must be localized onto the periodic interfaces defining the domains. In order for the microphase separated polymer regions to grow rapidly, the molecules quickly arrange their junctions with the respective blocks in the chemically identical domains. For microdomain interfaces parallel to the fast growth direction, this is readily accomplished, whereas for interfaces which are normal to the fast growth direction, repeated nucleation of these junction surfaces is required. For this 24 vol % PE diblock, there is more interface in a lamellar structure than in a cylindrical one, so the first structure to form is that which forms the fastest, namely layers oriented with their surface normal orthogonal to the fast growth direction of the BA. Of the degenerate set of such orientations, parallel and vertical layers are the most suitable because inclined orientations necessitate junction area density variations near the surface regions. Depending on the affinity of the respective blocks for the substrate surfaces, the film thickness and layer repeat, and the type of epitaxy and crystallizable block chain orientation with respect to the crystalline substrate, many scenarios are possible. In the present PS/PE system, for the parallel layer orientation, the structure may transform into vertical cylinders embedded in a PS matrix in order to accomodate the PS blocks due to the in-plane PE c axis orientation dictated by the epitaxy and consistent with the preferred microdomain interface curvature for this volume fraction.

Figure 12D:
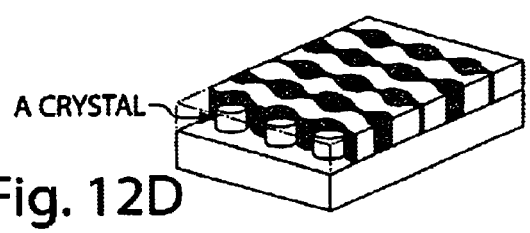
Figure 12E:
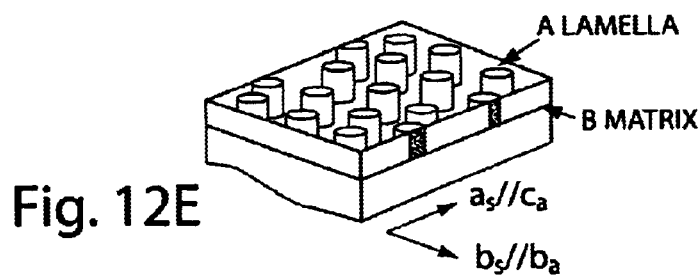

For the vertical layer orientation, the structure transforms as well again due to the instability of the flat interface at this composition as well as from the in-plane PE c axis orientation induced by the epitaxy. Both these possibilities are shown in FIG. 12d and each leads to the final observed structure as shown in FIG. 12e. Other block copolymer systems dissolved in benzoic acid or in anthracene were investigated and found that the directional solidification induced by a rapidly crystallizing solvent can readily orient microdomains in noncrystallizable block copolymers, suggesting that the extraction of the solvent from the polymer solution during directional solidification induces an organization of the block copolymer molecules into a well ordered microphase separated structure even without a specific epitaxial interaction with a crystallizable block. This fast process may have wide applicability to nanopatterning of thin films.

To check for the stability of the vertically oriented cylindrical structure, the sample was heated to 115C, above the glass transition temperature of the PS and the melting point of the PE but below the melting point of the PA. After about 30 minutes the BA completely sublimed. The sample was kept at 115 C for 1 day and then quenched into liquid N2 to vitrify the PS domains and to crystallize the PE block. TEM showed that the cylinders were still standing up in the thin film indicating that the vertically oriented structure is the equilibrium state or at least a strongly metastable state. Local near-surface reconstruction is possible, wherein the PS component forms a thin film over the PE component, but this may not occur due to the rapid loss of BA when held near its melting point (120C). The resultant electron diffraction pattern of the quenched film showed {110} powder diffraction rings, indicating small, randomly oriented PE crystals.

EXAMPLE 4

A poly(ethylene-b-(ethylenepropylene)-b-ethylene) triblock copolymer (PE/PEP/PE) was prepared by catalytic hydrogenation of poly(1,4-butadiene-b-1,4-isoprene-b-1,4-butadiene) (PB/PI/PB). The latter was synthesized by anionic polymerization in benzene at 20° C. with sec-butyllithium as initiator according to the standard high-vacuum techniques. The 1,4-additions of butadiene and isoprene units in the PB/PI/PB block copolymer give rise, after hydrogenation, to the PE end blocks and the alternating copolymer of ethylene and propylene (PEP) in the PE/PEP/PE copolymer. The small percentage of 3,4-additions of isoprene units produces, after hydrogenation, isopropyl branches in the PEP block, while the small percentage of 1,2-additions of butadiene units produces ethyl branches in the PE blocks. The estimated number of ethyl branches per 100 backbone carbon atoms in the PE block is two. The hydrogenation reaction was carried out using the standard procedure described elsewhere. The solvent was heptane, and the catalyst was palladium on calcium carbonate. $^1$H NMR showed that no double bonds remained.

Molecular weight characterizations were done using a combination of size exclusion chromatography (SEC) and low-angle laser light scattering. Tetrahydrofuran was used as solvent in both cases. For the PB/PI/PB sample the average molecular weight via light scattering was $M_w$)=55,000 g/mol, while SEC gave $M_z/M_w$ and $M_w/M_n$ ratios of 1.02 and 1.03, respectively. The molecular weight of each poly (1,4-butadiene) end block was approximately 10,000 g/mol, while that of the polyisoprene midblock was approximately 35,000 g/mol. Essentially the same molecular weights result for the corresponding hydrogenated blocks in the PE/PEP/PE sample. From the weight fractions of the blocks and assuming for the PE and PEP blocks densities at 140° C. of 0.78 and 0.79 g/cm$^3$, respectively, a volume fraction of the PE blocks in the block copolymer melt of 0.37 was estimated.

The melting temperature and the crystallinity index of the bulk polymer were obtained with calorimetric measurements using a Perkin-Elmer DSC-7, performing scans in a flowing $N_2$ atmosphere at heating rate of 2° C./min. The crystallinity index was calculated from the values of the experimental melting enthalpy and the value of the equilibrium melting enthalpy of a perfect crystal of PE (289 J/g). The crystallinity index of a sample crystallized from the melt by cooling to room temperature at a cooling rate of 2° C./min was nearly 30% with respect to the crystallizable PE blocks, corresponding to only about 10% with respect to the total weight of the block copolymer sample. The melting temperature of the PE/PEP/PE sample was 102° C., significantly lower than that of a high-density PE, indicative of the presence of the ethyl branches.

The bulk samples of the block copolymer used in the small-angle (SAXS) and wide-angle (WAXS) X-ray diffraction experiments were prepared by melting and recrystallization in order to eliminate any previous thermal history.

In-situ SAXS and WAXS measurements were carried out at the Advanced Polymer beamline, X27C, National Synchrotron Light Source (NSLS), Brookhaven National Laboratory (BNL). The wavelength used was λ=0.1307 nm, and the beam size at the sample position was about 0.4 mm in diameter. A three 2° tapered tantalum pinhole collimation system was used with sample-to-detector distances of 1560 and 108 mm for the SAXS and WAXS patterns, respectively. Scattering angles 2θ down to 1.5 mrad, corresponding to a spacing (d=2π/q, where q=4π sin θ/λ) of about 100 nm, were achieved in the SAXS pattern. The SAXS and WAXS patterns were recorded at various temperatures using a single-cell heating stage (maximum temperature: 350° C.). The sample was melted, and the patterns were recorded at different temperatures starting from the melt and cooling to room temperature at a cooling rate of 2° C./min. Fuji imaging plates were used to collect the scattering data with exposure times of 1 min per frame. The isotropic diffraction data were circularly averaged over the azimuthal coordinate of the two-dimensional patterns and plotted as a function of the scattering vector q and the Bragg angle 2θ for the SAXS and WAXS pattern, respectively.

Epitaxial crystallization of the block copolymer onto BA was performed following the procedure developed for the PE homopolymer. Thin films of the block copolymer were first formed on carbon-coated microscope glass slides by casting from xylene solution (0.1–0.3 wt %) at the room temperature. The film was then heated to 150° C. in the presence of benzoic acid, and a clear solution formed. The solution is then supercooled by placing the glass slide on a hot bar at 110° C. and contacting the edge of the coverslip with tweezers to induce crystallization of the BA ($T_m^{BA}$~123° C.). Rapid directional crystallization of the BA occurs, resulting in platelike crystals, whose sizes are about 500×200 μm, elongated in the crystallographic b direction, with large top and bottom (001) surfaces. The slide is then moved to a position on the hot bar with a temperature of 60° C. and held for a minute to complete the crystallization of the BA and induce the crystallization of the PE component in the directionally solidified structure of the mixture of BA and the block copolymer and finally cooled to room temperature. The BA crystals were then dissolved in ethyl alcohol at 50° C. The polymer film supported by the carbon film was floated off the glass onto water and picked up with copper grids (200 mesh) and analyzed in the transmission electron microscope in bright field and dark field mode as well as in selected area diffraction. Thin films of the copolymer crystallized by simple casting at room temperature from a xylene solution (0.1–0.3 wt %) on microscope glass slides were also analyzed for comparison. A JEOL 200CX and Philips CM12 TEM, operating at 200 and 120 kV, were used.

Bulk samples of the PE/PEP/PE block copolymer were analyzed by simultaneous WAXS and SAXS in order to check whether the crystallization of the PE blocks occurs from a homogeneous melt or from an already microphase-separated heterogeneous state. Thin films were analyzed by electron diffraction and electron microscopy under both bright and dark field mode in order to observe the orientation of the PE crystals and the microdomain morphology which develop in the epitaxial crystallization process.

Figure 13A:
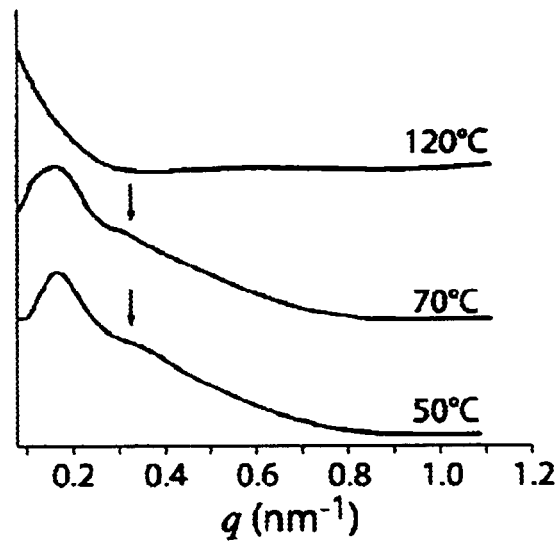
FIG. 13a is a copy of a small-angle X-ray diffraction patterns.
Figure 13B:
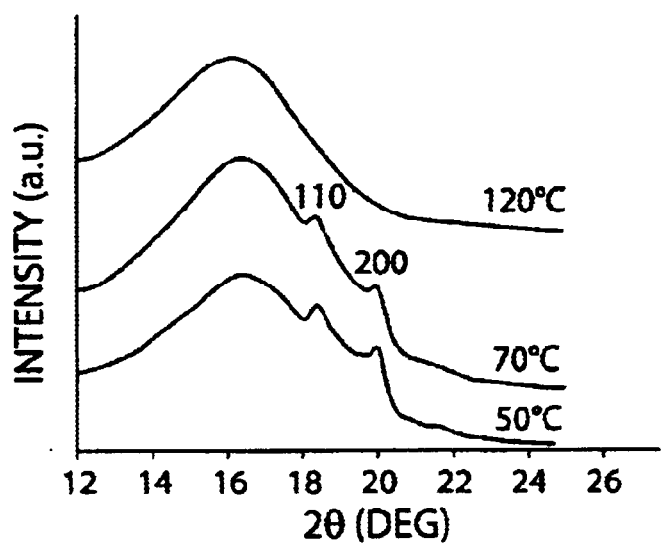
FIG. 13b is a copy of a wide-angle X-ray diffraction patterns of a bulk sample of the PE/PEP/PE block copolymer recorded at the indicated temperatures during cooling from a homogeneous melt.

SAXS and WAXS patterns of the PE/PEP/PE bulk sample, recorded simultaneously at a series of temperatures, starting from the melt and cooling to room temperature, are shown in FIGS. 13a and b, respectively. It is apparent that the SAXS pattern at 120° C. is essentially featureless, indicating that no microdomain structure is present in the melt. The correlation hole peak normally found in the disordered state of block copolymers is absent because of the very low electron density contrast between the PE and PEP blocks. This is contrary to the higher molecular weight sample analyzed by Seguela and Prud'homme, which yielded a microphase-separated melt. In the sample, the PE and PEP blocks are miscible in the melt (120° C.), which appears therefore as a homogeneous phase. The WAXS pattern of the melt (FIG. 13b) at 120° C. presents a typical amorphous halo. The intensity of the amorphous halo decreases due to the crystallization of PE block (at 70 and 50° C.). The two crystalline peaks correspond to the {110} and {200} reflections of the usual orthorhombic form of PE. In good correspondence to the temperature at which the crystalline peaks develop in the WAXS pattern, a peak at $q=0.16$ nm$^{-1}$, corresponding to a Bragg distance of 40 nm, develops in the SAXS patterns, indicating the formation of a microphase-separated microstructure. The weak broad reflection around 0.32 nm$^{-1}$, indicated by arrows in FIG. 13a, gives a ratio $q_2/q_1$ of about 2, characteristic of a lamellar structure, as was previously found in the weak segregated semicrystalline block copolymers. The parallel growth of the WAXS and SAXS peaks in the cooling step indicates that, in this sample of PE/PEP/PE block copolymer, the microphase separation is driven by crystallization from a single phase melt.

Figure 14:
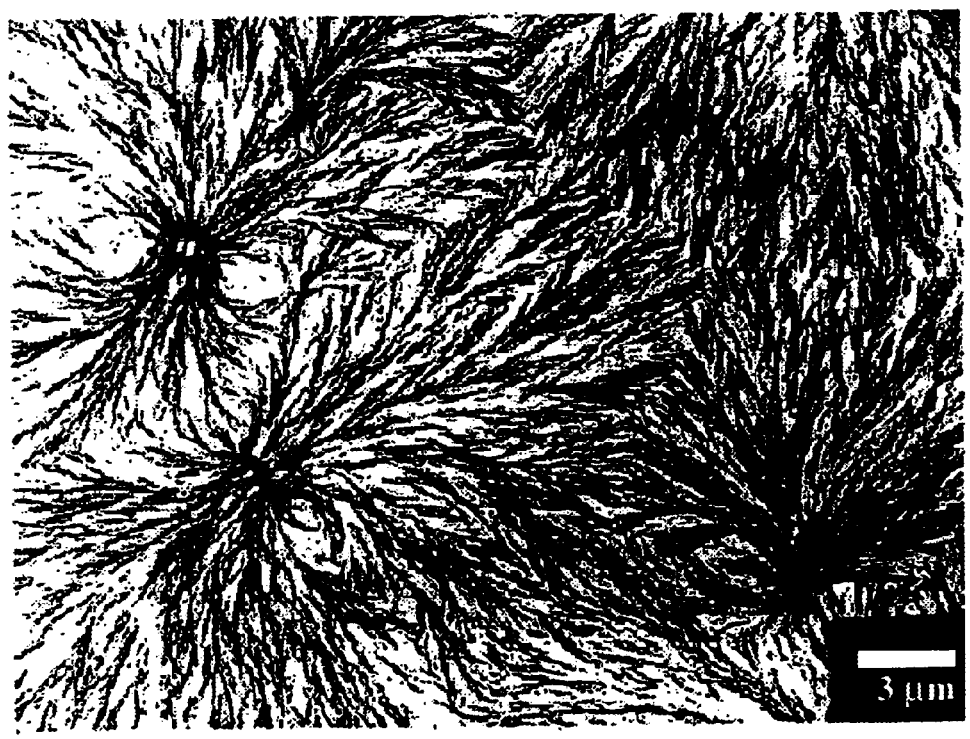
FIG. 14 is a copy of a TEM bright-field image of a thin film of PE/PEP/PE block copolymer obtained by casting from a xylene solution showing radially oriented lamellar PE microdomains, characterized by crystalline spherulites having size of 5–10 ím, are imaged through the diffraction contrast.

A bright-field TEM image of a thin film of the PE/PEP/PE sample, prepared by casting at room temperature on a microscope glass slide from dilute xylene solution, is shown in FIG. 14. The PE blocks crystallize by evaporation of the solvent, and in FIG. 14 radially oriented lamellar PE microdomains comprise volume-filling crystalline spherulites having an average diameter of 5–10 μm.

Figure 15:
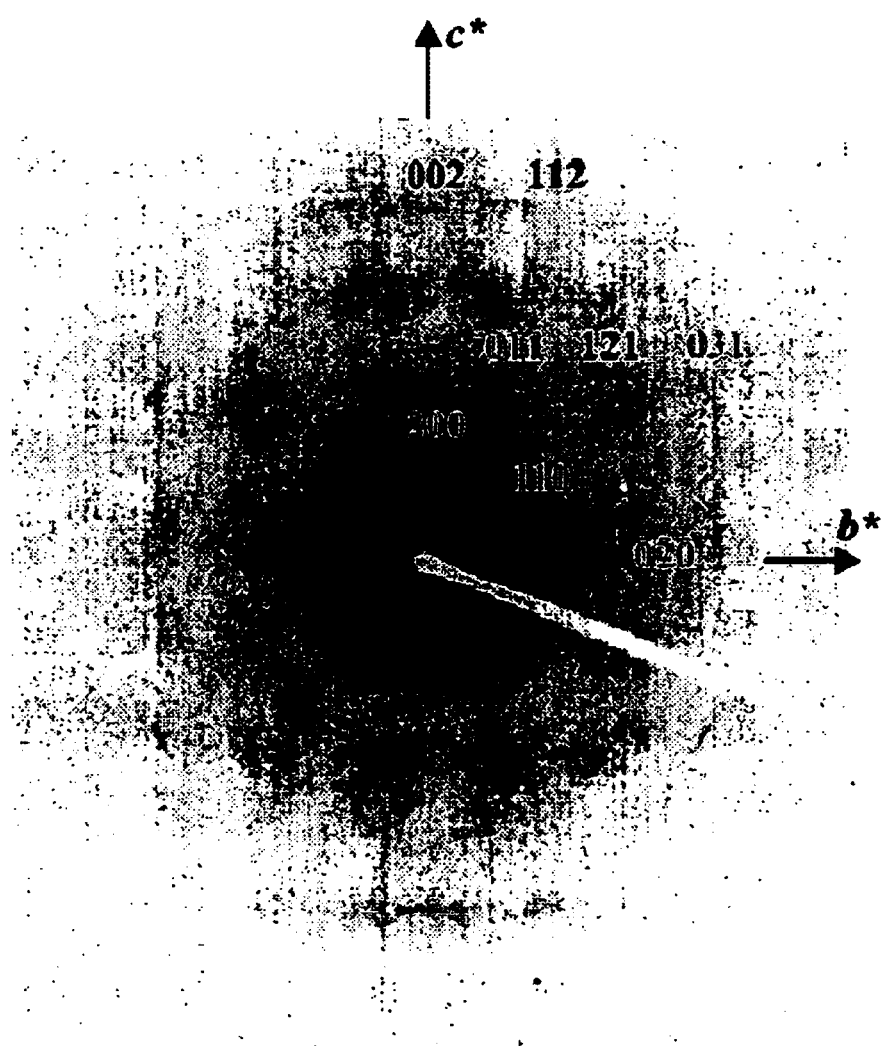
FIG. 15 is a copy of a selected area electron diffraction pattern of a thin film of PE/PEP/PE block copolymer epitaxially crystallized onto BA showing that the pattern presents mainly the 0 kl reflections of PE; hence, it indicates that the (100) plane of PE is normal to the electron beam and parallel to the (001) exposed face of the BA crystals. A small tilting of the lamellae around the b axis, or progressive tilting of successive stacks of lamellae, accounts for the presence of arced reflections as well as the 1 kl and 2 kl type reflections (in particular, 121 and 112 reflections) and the weak 110 and 200 reflections.

To avoid the typical spherulite structure and control the morphology, thin films of the block copolymer were epitaxially crystallized onto the (001) surface of crystals of BA following a method outlined above. The selected area electron diffraction pattern of the PE/PEP/PE block copolymer using a 6 μm diameter SAD aperture is shown in FIG. 15. The pattern essentially presents only the 0 kl reflections of PE; therefore, it corresponds to the b*c* section of the reciprocal lattice of PE. This indicates that a high orientation (single-crystal-like) of the chain molecules in the crystalline phase has been achieved. Since the b*c* section of the reciprocal lattice is in the diffraction condition, the chain axis of the crystalline PE lies flat on the substrate surface and oriented parallel to the a axis of BA crystals, as in the case of the PE homopolymer. The (100) plane of PE is in contact with the (001) plane of BA; therefore, the crystalline PE lamellae stand edge-on on the substrate surface, with PE b axis oriented parallel to the b axis of BA. The relative orientation of PE and substrate lattices is therefore identical to that obtained for the polyethylene homopolymer. The b and c axes of PE are parallel to the b and a axes of BA, respectively; this epitaxy is well explained in terms of matching the PE interchain distance of the b PE axis periodicity (4.95 Å) with the b periodicity of the BA unit cell (5.25 Å).

Figure 16A:
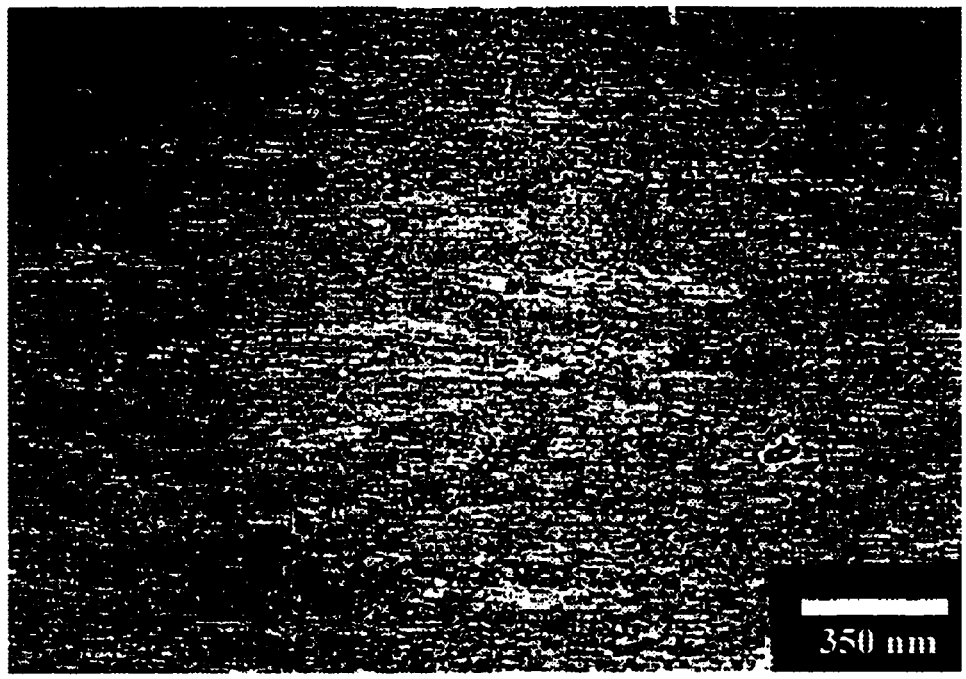
FIG. 16a is a copy of an under-focused TEM bright-field image of a thin film of PE/PEP/PE block copolymer epitaxially crystallized onto BA corresponding to an area similar to that of FIG. 15 where the light noncrystalline regions appear bright due to phase contrast and the dark regions correspond to the denser crystal-line PE phase, which form long lamellae standing edge-on on the substrate surface and wherein the lamellae are preferentially oriented with the b axis of PE parallel to the b axis of the BA.

A bright field TEM image of the film epitaxially crystallized onto BA is shown in FIG. 16a. Phase contrast obtained by underfocus of the objective lens makes the noncrystalline regions appear bright. Instead of a spherulitic structure, the epitaxy has produced a highly aligned lamellar structure with long, thin crystalline PE lamellae, with a thickness of 10–15 nm, oriented along the $[010]_{PE}//[010]_{BA}$ direction. The average distance between the lamellae is 30–40 nm, in agreement with the bulk SAXS data, and the order extends over a larger than 100 μm$^2$ region.

Figure 16B:
FIG. 16b is a copy of a TEM (110) dark-field image of a thin film of PE/PEP/PE block copolymer epitaxially crystallized onto BA corresponding to an area similar to that of FIG. 15 and showing long thin, highly parallel alternating regions of bright/dark contrast are evident over the field of view and wherein the bright regions correspond to the crystal-line PE lamellae in the Bragg condition and the dark regions crossing the lamellar structure correspond to crystalline areas where the crystals are tilted or twisted out of the Bragg condition.

Further details of the structure and orientation of the film can be made by dark field (DF) imaging of the PE crystalline lamellae. Since the film has a single-crystal-like orientation, dark field imaging using a single diffraction spot should reveal the entire set of crystalline regions. In view of the limited lifetime of PE crystals under the electron beam, it is preferable to use the strongest 110 reflection to record DF images. For this purpose, the epitaxially crystallized film was tilted by 34° about the c axis of PE in order to bring the 110 reflection in diffracting position. The corresponding DF image shown in FIG. 16b reveals the same parallel array of crystalline PE lamellae, oriented along the b axis of BA crystals, with 40–50 nm interlamella spacing. The dark areas in the image correspond to regions slightly out of the Bragg condition due to a small amount of tilting.

The thickness of the crystalline PE domains is approximately 10–15 nm, almost comparable to that of amorphous PE and PEP layer. On the basis of the PE volume fraction, bulk crystallinity (30%), and microdomain lamellar repeat, a crystal thickness of around 4–5 nm would be expected for bulk crystallized material. The larger crystal thickness observed may be due to an enhancement of crystallinity by the substrate.

In strongly segregated semicrystalline block copolymers, epitaxially crystallized onto an organic substrate, the resulting structure can be understood in terms of a combination of directional solidification of the eutectic solution of the block copolymer in the crystallizable organic solvent and the following epitaxial crystallization of the crystalline block onto the organic crystalline substrate. The eutectic behavior of binary solutions of a semicrystalline homopolymer and a crystallizable organic solvent has been described in the literature. In the present case, where the two blocks are miscible above the crystallization temperature of the PE block (melt compatible semicrystalline block copolymer), the orientation of the microdomains occurs only due to epitaxial relationship of the PE block with the BA.

Figure 17:
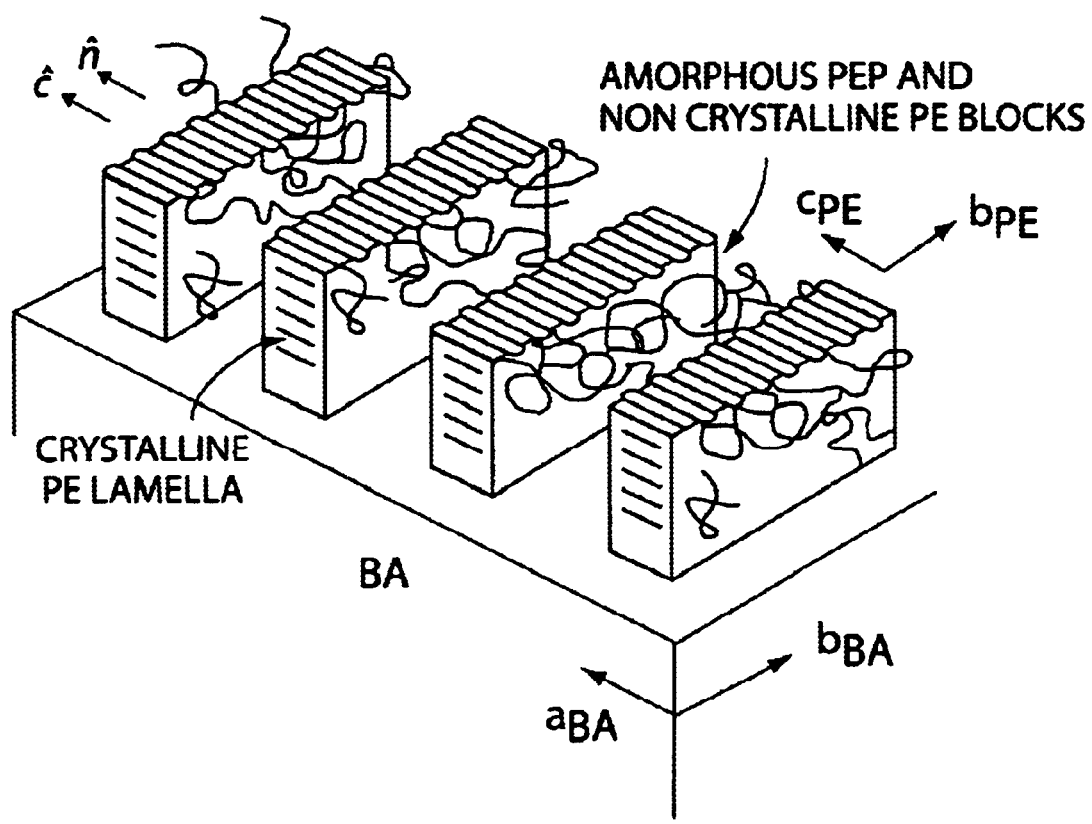
FIG. 17 is a schematic model showing the crystalline and amorphous microdomains in the PE/PEP/PE block copolymer epitaxially crystallized onto BA where the epitaxial relationship shows the relative orientation of the polyethylene lamellae on the benzoic acid and (100)PE//(001)BA, and cPE//aBA, bPE//bBA and wherein the orientation of the PE molecular chains perpendicular to the lamellar plane c^//n^ is also shown.

This example shows how to control the microstructure of a semicrystalline block copolymer by a highly specific molecular interaction with the substrate. High orientation of the crystals and microdomains of a PE/PEP/PE triblock copolymer has been achieved through epitaxial crystallization of the copolymer, from the homogeneous melt, onto benzoic acid substrate crystals. The epitaxial crystallization is used to control the crystallization and the morphology of a thin film of block copolymer. Since the microphase separation is driven by crystallization from a homogeneous melt, the long-range orientation of the crystalline unit cell induces excellent alignment of the microdomains, as shown in the schematic model of FIG. 17. The PE microdomains consist of long crystalline lamellae aligned parallel to a preferential crystallographic direction of the substrate (the b axis of the benzoic acid crystals, parallel to the b axis of PE). The combination of electron diffraction and bright and dark field images allows clear determination of the molecular chain orientation of PE with respect to the suprastructure of crystalline PE lamellae and PEP layers. The orientation of the PE unit cell, induced by the epitaxial relationship with the crystalline lattice of the substrate, is such that the PE molecular chain axis (ĉ) is parallel to the normal direction (n^) of lamellar plane, as shown in FIG. 17. The result is, it is believed, a consequence of the interaction with the substrate surface in the thin film and yields a globally oriented single-crystal-like texture of vertically oriented PE/PEP lamellae.

Those skilled in the art would readily appreciate that all parameters and configurations described herein are meant to be exemplary and that actual parameters and configurations will depend upon the specific application for which the systems and methods of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to at least each individual feature, system, or method described herein. In addition, any combination of two or more such features, systems or methods, provided that such features, systems, or methods are not mutually inconsistent, is included within the scope of the present invention.

What is claimed is:

1. A method comprising:
   forming a solution including a block copolymer and a solvent for the block copolymer;
   forming a film using the solution; and
   separating components of the block copolymer based at least in part on crystallization of the solvent to form microdomains of components of the block copolymer in the film, each microdomain including at least one microstructure formed by at least one component of the block copolymer.

2. The method of claim 1, wherein the step of separating comprises removing solvent from the film.

3. The method of claim 2, wherein the step of removing solvent comprises crystallizing solvent in the film to form at least one crystal structure.

4. The method of claim 1, wherein the step of separating components comprises directionally solidifying at least one component of the block copolymer.

5. The method of claim 1, wherein the step of separating components comprises crystallizing at least one component of the block copolymer under the influence of a crystal-containing substrate.

6. The method of claim 5, wherein the crystallized substrate includes crystallized solvent and the at least one component crystallizes in an alignment with the crystallized solvent.

7. The method of claim 1, wherein the step of forming a film comprises forming a film of the solution that is less than a dimension of one period of the block copolymer.

8. The method of claim 1, wherein the step of forming a film comprises applying the solution to a contoured substrate so the resulting film has a different thickness at two different areas.

9. The method of claim 8, wherein portions of the film in a first area having a first thickness includes microdomains having at least one microstructure formed by a first component of the block copolymer that is different in type or orientation from at least one microstructure formed by the first component of the block copolymer in a second area having a second thickness.

10. The method of claim 1, wherein one component of the block copolymer forms a cylindrical structures in microdomains of the one component, the cylindrical structures being substantially vertically aligned with respect to the plane of the film.

11. The method of claim 1, wherein one component of the block copolymer forms lamellar structures in microdomains of the one component.

12. The method of claim 1, wherein the microdomains including one of the components of the block copolymer are periodically oriented spatially and regularly oriented directionally.

13. The method of claim 1, wherein the solvent has a melting point greater than 100° C. and is crystallizable.

14. The method of claim 1, wherein the solvent is one of benzoic acid, anthracene, and naphthalene.

15. A method comprising:
   providing a solution of a block copolymer dissolved in a crystallizable solvent;
   forming a layer of the solution, the layer having regions of different thickness; and
   phase separating components of a block copolymer in the presence of the crystallizable solvent, the regions of different thickness having different orientations of phase separated components of the block copolymer.

16. The method of claim 15, wherein the step of phase separating comprises directional phase separating components of the block copolymer.

17. The method of claim 16, further comprising:
   forming a solution of the block copolymer and the crystallizable solvent; and
   wherein the step of directional phase separating comprises inducing directional crystallization of the crystallizable solvent.

18. The method of claim 15, wherein the step of phase separating components comprises:
   phase separating the block copolymer to form microdomains of components of the block copolymer having an orientation influenced by a crystal structure of the crystallized solvent.

19. The method of claim 15, wherein the step of forming a layer comprises forming a film of the solution that is less than a dimension of one period of the block copolymer.

20. The method of claim 15, wherein the step of forming a layer comprises applying the solution to a contoured substrate.

21. The method of claim 20, wherein the contoured surface is topographically patterned and includes a plurality of protrusions and indentations, and wherein the film of solution includes relatively thicker portions in register with indentations and relatively thinner portions in register with protrusions of the surface.

22. The method of claim 21, wherein portions of the film in register with indentations of the surface include microdomains of a component of the block copolymer having an orientation different from an orientation of microdomains of the component of the block copolymer in other portions of the film in register with protrusions of the surface.

23. The method of claim 18, wherein at least some microdomains include cylindrical structures substantially vertically aligned with respect to a plane of the substrate.

24. A method comprising:
   dissolving a block copolymer in a solvent having a boiling point greater than 50° C.; and
   phase separating components of the block copolymer at least in part based on crystallization of the solvent which influences the orientation of the phase separated components of the block copolymer.

25. The method of claim 24, wherein the solvent has a boiling point greater than 70° C.

26. The method of claim 24, wherein the solvent has a boiling point greater than 100° C.

27. The method of claim 24, wherein the solvent has a boiling point greater than 150° C.

28. The method of claim 24, wherein the solvent has a boiling point greater than 200° C.

29. The method of claim 24, wherein the solvent has a melting point greater than 100° C.

30. The method of claim 24, wherein the solvent has a melting point greater than 150° C.

31. The method of claim 24, wherein the solvent has a melting point greater than 200° C.

32. The method of claim 24, further comprising inducing crystallization of the solvent to phase separate components of the block copolymer.

33. The method of claim 24, wherein the solvent is selected from among benzoic acid, anthracene, and naphthalene.

34. The method of claim 24, further comprising applying the block copolymer dissolved in the solvent on a substrate to form a film, and then crystallizing the solvent.

35. A portion of a film including a pattern of nanostructures, comprising:
   components of a block copolymer phase separated by directional solidification caused by crystallization of a solvent to form a pattern including a plurality of microdomains, a first set of microdomains including a first component of the block copolymer forming a first structure type having a first orientation, and a second set of microdomains including a second component of the block copolymer forming a second structure type having a second orientation, wherein the first and second sets of microdomains are periodically oriented spatially and regularly oriented directionally.

36. The film of claim 35, wherein the block copolymer comprises at least two components A and B.

37. The film of claim 35, wherein the block copolymer includes at least three components A, B, and C.

38. The film of claim 35, wherein the first structure type includes one of a cylindrical structure, a spherical structure, and a lamellar structure.

* * * * *